United States Patent
Ohashi et al.

[11] Patent Number: 6,059,885
[45] Date of Patent: May 9, 2000

[54] VAPOR DEPOSITION APPARATUS AND METHOD FOR FORMING THIN FILM

[75] Inventors: Tadashi Ohashi, Sagamihara; Katuhiro Chaki, Hadano; Ping Xin, Sagamihara; Tatsuo Fujii, Tokuyama; Katsuyuki Iwata, Kudamatu; Shinichi Mitani, Numazu; Takaaki Honda, Mishima, all of Japan

[73] Assignees: Toshiba Ceramics Co., Ltd.; Toshiba Kikai Kabushikikaisha, both of Tokyo, Japan

[21] Appl. No.: 08/991,407

[22] Filed: Dec. 16, 1997

[30] Foreign Application Priority Data

Dec. 19, 1996 [JP] Japan .................................. 8-354380
Dec. 19, 1996 [JP] Japan .................................. 8-354381

[51] Int. Cl.⁷ .................................................. C23C 16/00
[52] U.S. Cl. ..................................... 118/730; 118/715
[58] Field of Search .................................. 118/715, 730; 204/298.7, 298.28

[56] References Cited

U.S. PATENT DOCUMENTS

| | | | |
|---|---|---|---|
| 4,348,981 | 9/1982 | Nakanisi et al. | 118/730 |
| 4,989,541 | 2/1991 | Mikoshiba et al. | 118/723 MW |
| 4,997,677 | 3/1991 | Wang et al. | 427/248.1 |
| 5,173,336 | 12/1992 | Kennedy | 427/248 |
| 5,221,556 | 6/1993 | Hawkins et al. | 427/255 |
| 5,264,040 | 11/1993 | Geyling | 118/728 |
| 5,496,408 | 3/1996 | Motoda et al. | 118/715 |
| 5,500,256 | 3/1996 | Watabe | 427/579 |
| 5,792,272 | 8/1998 | van Os et al. | 118/723 IR |

FOREIGN PATENT DOCUMENTS

| | | |
|---|---|---|
| 0 502 209 | 4/1992 | European Pat. Off. |
| 59-72718 | 4/1984 | Japan . |
| 60-39832 | 3/1985 | Japan ................................. 156/345 |
| 60-189928 | 9/1985 | Japan . |
| 61-5515 | 1/1986 | Japan ................................. 118/715 |
| 61-180424 | 8/1986 | Japan ................................. 156/611 |
| 62-60875 | 3/1987 | Japan ................................. 118/723 E |
| 1-286306 | 11/1989 | Japan ................................. 118/715 |
| 4-187594 | 7/1992 | Japan . |
| 5-74719 | 3/1993 | Japan . |
| 5-90167 | 4/1993 | Japan . |
| 6-216045 | 8/1994 | Japan . |
| 7-50260 | 2/1995 | Japan . |

OTHER PUBLICATIONS

P. N. Gadgil, "Optimization of a Stagnation Point Flow Reactor Design for Metalorganic Chemical Vapor Deposition by Flow Visualization", Journal of Crystal Growth, vol. 134, Dec. 1993, pp. 302–312.

*Primary Examiner*—Jeffrie R Lund
*Attorney, Agent, or Firm*—Foley & Lardner

[57] ABSTRACT

A vapor deposition apparatus includes a cylindrical hollow reactor having gas supply ports at its upper portion and an exhaust port at its bottom portion. A rotational substrate holder, which seats a wafer substrate, is concentrically placed inside the reactor. The reactor has a straightening vane having gas holes concentrically positioned at its upper portion. Reaction gas is supplied into the reactor to form a thin film on the surface of the wafer substrate on the rotational substrate holder by vapor deposition. In one embodiment, the straightening vane is configured so that the flow rate of the reaction gas in the center portion covering the area of the wafer substrate and the gas flow rate of the reaction gas in the outer portion of the center portion are different from each other. In another embodiment, the reactor is sectioned into upper and lower portions. The inner diameter of the upper portion is smaller than the inner diameter of the lower portion. A link portion connects the lower end of the upper portion and the upper end of the lower portion. The link portion is provided with straightening gas flow-out holes. The rotational substrate holder is positioned below the lower end of the upper portion of the reactor by a predetermined height difference.

25 Claims, 10 Drawing Sheets

VAPOR DEPOSITION APPARATUS AND METHOD FOR FORMING THIN FILM

BACKGROUND OF THE INVENTION

1. Field of the Invention

The present invention relates vapor deposition apparatus and method for forming a thin film, and more particularly to vapor deposition apparatus and method which are applied to a process for manufacturing a semiconductor wafer substrate to which high quality is required, and which can suppress occurrence of contaminants such as particles, etc. in vapor phase and deposits on the wall of a reactor to thereby form a thin film having uniform film thickness, so that a homogeneous semiconductor wafer having no dispersion in resistance value and little crystal defect.

2. Description of the Related Art

FIG. 14 shows a conventional vapor deposition apparatus for forming a thin film. In FIG. 14, a rotational substrate holder 82 for mounting a wafer substrate 81 such as a silicon wafer or the like, a rotational shaft 83 for rotating the rotational substrate holder 82 and a heater 84 for heating are generally disposed at the lower portion in a cylindrical reactor 80, and a rotating motor (not shown) is connected to the rotational shaft 83. Further, plural exhaust ports 85 for exhausting non-reacted gas, etc. are disposed at the bottom portion of the reactor 80 and connected to an exhaust control device (not shown). Further, plural gas supply pipes 86 for supplying raw-material gas and carrier gas into the reactor and a disc-shaped straightening vane 87 are provided at the top portion of the reactor 80. The straightening vane 87 is perforated with many holes 87a for regulating flow of gas.

The conventional vapor deposition apparatus is constructed as described above, and the substrate 81 mounted on the rotational substrate holder 82 which is rotated at a predetermined rotational number by the rotation of the motor is heated to a predetermined temperature by the heater 84 while rotated. At the same time, reaction gas such as raw-material gas, carrier gas, etc. are introduced through the plural gas supply pipes 86 into the reactor 80 to make the momentum of the gas and the pressure distribution uniform, and then passed through the many holes 87a of the straightening vane so that the gas flow-rate distribution in the reactor is uniform, whereby the reaction gas is uniformly supplied onto the wafer substrate 81 on the rotational substrate holder 82 to grow a thin film in vapor phase.

In the vapor deposition apparatus for forming a thin film on a semiconductor wafer as described above, various proposals have been made to prevent occurrence of particles and adhesion of deposits to the inner wall of the reactor due to the thin film forming gas, and also to prevent occurrence of crystal defects due to some troubles in a thin film forming process to thereby obtain a wafer having a thin film which is homogenous and uniform in film thickness. For example, in Japanese Laid-open Patent Application No. Hei-5-74719, the supply flow amount of the raw-material gas is controlled to a predetermined value to prevent the temperature variation in the reactor, thereby suppressing crystal defects. In Japanese Laid-open Patent Application No. Hei-5-90167, the raw-material gas amount, the pressure in the reactor, the rotational number of the rotational substrate holder, etc. are controlled to predetermined values so that the in-plane temperature distribution of the wafer substrate in the thin film forming process is made uniform, thereby preventing slip. In Japanese Laid-open Patent Application No. Hei-6-216045, a part of the inner wall of the reactor in which deposits are liable to occur is provided with a shielding pipe while the inner peripheral surface thereof is kept smoothened, thereby facilitating a cleaning work of the reactor after the thin film forming operation is performed and also the gas flow is kept to a laminar flow state to form a homogenous thin film. Further, in Japanese Laid-open Patent Application No. Hei-7-50260, a method of introducing the raw-material gas and the carrier gas into the reactor is set to a predetermined one to thereby make uniform the gas momentum and the gas pressure, whereby the raw-material gas, etc. are supplied onto the substrate at a uniform flow rate to make the film thickness uniform.

However, the various proposed conventional vapor deposition apparatuses as described above have not yet been cable of sufficiently preventing troubles such as the occurrence of the crystal defect, the adhesion of particles on a wafer substrate on which a thin film is formed, etc. Further, particularly, following recent ultra-high integration of semiconductors, higher quality has been increasingly required to wafer substrates, and reduction in quality due to a slight defect on a thin-film formed wafer substrate induces a critical problem in many cases.

SUMMARY OF THE INVENTION

In view of the problem in reduction in quality of a wafer substrate on which a thin film is formed by vapor deposition according to the conventional vapor deposition apparatus as described above, the present invention has been implemented to solve the above problem. First, the inventors of this applicant have made detailed considerations on the phenomena occurring in the conventional vapor deposition apparatuses. As a result, they have observed such a phenomena that lots of particles adhere to the wall of the reactor, and. found out that this phenomenon shorts the maintenance cycle, and the particles adhering to the wall of the reactor also adhere to a wafer substrate to cause crystal defects or directly cause the reduction in quality of the wafer substrate.

From the above knowledge, in order to further find out the cause of the phenomenon that lots of particles adhere to the wall of the reactor, the inventors have also made considerations on the flow of raw-material gas in the reactor, etc. As a result, it has been found out that the following phenomenon occurs in the reactor.

That is, (1) in the conventional reactor, reaction gas such as silicon raw-material gas, etc. which are introduced from the top portion of the reactor and supplied onto a wafer substrate 81 at a uniform flow rate, reaches the vicinity of the wafer substrate 81 at the lower portion of the reactor 80 which is heated to a high temperature from the upper portion thereof by a heater 84, and heated therein. As a result, as indicated by an arrow of FIG. 14, an upward-moving stream of the reaction gas occurs to induce a blow-up phenomenon of the reaction gas along the wall of the reactor, so that an eddy flow of gas occurs. (2) Since the heated reaction gas flows upwardly, the temperature of the overall area in the reactor 80 is also increased to promote uniform nucleus formation of thin-film forming raw-material gas in vapor phase, so that occurrence of particles is increased in vapor phase. (3) Further, when the gas eddy flow occurs, dopant in the reaction gas may be re-doped at the outer periphery portion of the wafer substrate 81 on the rotational substrate holder 82, resulting in uniformity of the in-plane resistance value distribution of the wafer substrate thus obtained. (4) Still further, aside from the occurrence of the gas eddy flow, the blow-up phenomenon in which the reaction gas flowing down to the vicinity of the wafer substrate upwardly moves in the reactor produces so-called "disturbance of gas" in which the gas flow becomes complicated at the outer periphery side of the rotational substrate holder 82. The disturbance of the gas flow promotes reaction of non-reacted gas which should be exhausted from an exhaust port 85, so that thin film components are deposited on the outer periphery surface of the rotational substrate holder 82, and particles adhere to the wall of the reactor which confronts the outer peripheral surface of the rotational substrate holder 82.

The occurrence of the gas eddy flow and the disturbance of the gas flow which induce various troubles can be suppressed to some extend by setting the gas flow rate in the shaft direction of the rotational substrate holder to an extremely high value, for example, about 1 m/s or more. However, in order to satisfy this condition, a large amount of carrier gas must be supplied, and this is industrially impractical.

Further, the inventors have attempted that in order to suppress the occurrence of the gas eddy flow, the upper portion of the reactor is set to be narrower in diameter than the lower portion of the reactor to narrow the space in which the high temperature reaction gas flows upwardly and prevent the occurrence of the gas eddy flow. In this case, the particle adhesion, etc. at the upper portion of the reactor, etc. can be prevented. However, as indicated by an arrow in FIG. 13 which schematically shows a vapor deposition apparatus with a reactor having a narrower upper portion, which is used as a comparison example as described later, it as found out that gas eddy flow and gas flow disturbance occurred at a diameter-larger portion of the reactor locating at the outside of the rotational substrate holder. When gas eddy flow or gas flow disturbance occurs at a diameter-larger portion, the area of the reactor where the problems such as the adhesion of the particles to the peripheral wall of the lower portion of the reactor, the adhesion of the thin film components due to reaction of non-reacted gas, etc. is merely varied, and thus it is apparent that such a trouble that the maintenance cycle is shortened, etc. occur.

SUMMARY OF THE INVENTION

Therefore, the inventors have made various studies on the structure of a vapor deposition apparatus for forming a thin film which can suppress occurrence of gas eddy flow and disturbance of gas flow due to ascent of gas flow in a reactor to thereby avoid undesired phenomena such as occurrence of lots of ascending particles, adhesion of lots of particles to the inner wall of the reactor, deposition of thin-film forming components, re-doping of dopant into the outer peripheral portion of the wafer, etc. As a result, the inventors have found out that the above problem could be solved by any of a vapor deposition apparatus having such a structure that a straightening vane having a specific structure is disposed in a specific arrangement so that the gas flow rate is varied between the center portion and the outer peripheral portion in the reactor, and a vapor deposition apparatus having such a structure that a reactor is designed to have an upper portion having a smaller diameter and a lower portion having a larger diameter, a straightening (rectifying) gas flow-out hole is provided at the link portion between the upper portion and the lower portion which are different in diameter, the straightening gas is supplied through the flow-out hole, and the ratio of the inner diameter of the upper portion of the reactor, the inner diameter of the lower portion of the reactor and the diameter of the rotational substrate holder is set to a predetermined value to rectify the disturbance of gas flow in the reactor containing the diameter-larger portion, and have implemented the present invention on the basis of the above knowledge.

Accordingly, an object of the present invention is to provide a vapor deposition apparatus for forming a thin film which can prevent occurrence of lots of ascending particles, adhesion of lots of particles to the wall of a reactor and deposition of thin film forming components to thereby suppress occurrence of crystal defects on a wafer substrate and re-doping of dopant into the outer peripheral portion of the wafer, thereby obtaining a high-quality wafer substrate on which a thin film having little crystal defect and an uniform thickness is laminated.

Further, another object of the present invention is to provide a method of forming a high-quality thin wafer substrate having little defect and an uniform film thickness with the above vapor deposition apparatus by vapor deposition.

According to a first aspect of the present invention, a vapor deposition apparatus for forming a thin film which includes plural reaction gas supply ports at the top portion of a hollow reactor, an exhaust port at the bottom portion of the reactor, a rotational substrate holder which is provided inside the reactor and adapted to mount a wafer substrate, a ceiling portion and a space area at the upper portion in the reactor, and a straightening vane having plural gas holes formed therein, thereby forming a thin film on the surface of a wafer substrate on the rotational substrate holder by supplying the reaction gas into the reactor, is characterized in that the gas flow rate at the center portion and the gas flow rate at the peripheral portion in the reactor are set to be different.

In the vapor deposition apparatus of the first aspect of the present invention, it is preferable that the straightening vane is brought into close contact with the peripheral wall of the reactor, and the opening degree of the gas hole is set to be larger in an outer area extending radially outwardly from the outer peripheral edge of the orthogonal projection shape of the rotational substrate holder which is obtained by orthogonally projecting the rotational substrate holder onto the straightening vane in the radial direction than that in the other area, so that the gas flow rate is different between the center portion and the outer peripheral portion in the reactor. Alternatively, it is preferable that the outer peripheral edge of the straightening vane and the peripheral wall in the reactor has a gap therebetween, and the outer peripheral edge of the straightening vane is located in the outer area extending radially outwardly from the outer peripheral edge of the orthogonal projection shape of the rotational substrate holder orthogonally projected to the straightening vane in the radial direction so that the gas flow rate is made different between the center portion in the reactor and the outer peripheral portion of the reactor.

In these cases, the outer area has a predetermined interval (gap width) from the inner peripheral wall in the reactor, and the ratio (X/Y) of the interval width (X) and the difference ($Y=R_D-R_P$) of the equivalent radius ($R_D$) of the straightening vane and the equivalent radius ($R_P$) of the orthogonal projection shape is preferably set to 0.02 to 1.0, and more preferably to 0.05 to 0.5. Further, it is preferable that the horizontal section of the reactor is circular, and the straightening vane and the rotational substrate holder are disposed concentrically. That is, the opening degree is set to a large value. Further, it is preferable that the interval width between the inner wall of the reactor and the outer area at which the outer peripheral edge of the straightening vane having a gap with the inner periphery of the reactor is located is set to be equal to the difference in radius between the straightening vane and the rotational substrate holder or 0.02 time of the difference or more.

Further, in the vapor deposition apparatus according to the first aspect of the present invention, it is preferable that the space area is divided into at least two sections by a partition member which is located in the outer area extending radially outwardly from the outer peripheral edge of the orthogonal projection shape of the rotational substrate holder orthogonally projected to the straightening vane, and two or more reaction gas supply ports are provided to each of the sections to make the gas flow rate different between the center portion in the reactor and the outer peripheral portion of the reactor. In these cases, the outer area has a predetermined gap width from the inner peripheral wall in the reactor, and the ratio (X/Y) of the interval width or radial distance (X) and the difference ($Y=R_D-R_P$) of the equivalent radius ($R_D$) of the straightening vane and the equivalent radius ($R_P$) of the orthogonal projection shape is preferably set to 0.02 to 1.0, and more preferably to 0.05 to 0.5. Further, it is preferable that the horizontal section of the reactor is circular, and the straightening vane and the rotational substrate holder are disposed concentrically. That is, the opening degree is set to a large value. Further, it is preferable that the interval width between the inner wall of the reactor and the outer area at which the outer peripheral edge of the straightening vane having a gap with the inner periphery of the reactor is located is set to be equal to the difference in radius between the straightening vane and the rotational substrate holder or 0.02 time of the difference or more. Still further, it is preferable that an individual reaction gas supply system is connected through the reaction gas supply port every section so that the gas flow rate is made difference between the center portion in the reactor and the outer peripheral portion of the reactor.

Still further, in the vapor deposition apparatus of the present invention, the hollow inside of the reactor is sectioned into upper and lower portions which are difference in equivalent inner diameter, and the equivalent inner diameter of the upper portion is set to be smaller than the equivalent inner diameter of the lower portion while the lower end of the upper portion and the upper end of the lower portion are connected to each other so that the hollow insides thereof are continuous with each other.

Further, according to the present invention, there is a thin film vapor deposition method in which the reaction gas is passed through the straightening vane to be straightened (rectified) by using the thin film vapor deposition apparatus of the first aspect, and the reaction gas is supplied onto the wafer substrate on the rotational substrate holder so that the reaction gas flow rate after straightened (rectified) is higher in the outer area than in the other area. In the vapor deposition method, the flow rate ration (Vx/Vz) of the gas flow rate (Vx) at the outer area and the gas flow rate (Vz) at the other area is set to 5 to 30, and more preferably to 10 to 20.

Further according to the present invention, there is provided a vapor deposition method in which after reaction gas is supplied from the upper side into a hollow reactor, the reaction gas is streamed down onto a wafer substrate which is rotationally supported at the lower side in the reactor to form a thin film on the wafer substrate by vapor deposition, the reaction gas being supplied so that after the reaction gas is straightened (rectified), the gas flow rate (Vx) at the peripheral area of the inner wall of the reactor is higher than the gas flow rate (Vz) at the upper area of the wafer substrate. In this vapor deposition method, the flow rate ratio (Vx/Vz) of the gas flow rate (Vx) at the peripheral area of the inner wall of the reactor and the gas flow rate (Vz) at the upper area of the wafer substrate is set to 5 to 30, and more preferably to 10 to 20.

In the vapor deposition apparatus and the vapor deposition method using the same according to the first aspect of the present invention which are constructed as described above, the reaction gas such as raw-material gas, carrier gas, etc. are supplied into the space area through the plural gas supply ports to make uniform the momentum and the pressure distribution of the gas, and the gas holes are formed and arranged so that the opening degree of the gas holes of the straightening vane is set to be larger at a predetermined outer peripheral area in the plane of the straightening vane than at the other areas (mainly the center area), thereby increasing the reaction flow rate at the peripheral portion of the inner wall of the reactor at the lower side of the straightening vane. Accordingly, unlike the conventional method, the reaction gas flow reaches to the surface of the wafer substrate on the rotational substrate holder and flows in the radial direction, and then the non-reacted gas smoothly flows from the outer peripheral side of the rotational substrate holder to the exhaust port at the bottom portion of the reactor without forming the ascending flow of the non-reacted gas along the wall of the reactor by the high-speed gas flow on the peripheral side of the inner wall of the reactor. Accordingly, the increase of the temperature of the gas in the reactor is suppressed, the uniform nucleus formation is also suppressed, and the occurrence of particles is prevented, thereby preventing the adhesion of parties to the wall in the reactor, the deposition of thin-film forming components, and formation of crystal defects on the wafer substrate due to adhesion of adhesive particles.

Further, since the smooth gas flow is kept, the dopant can be prevented from being re-doped into the outer peripheral portion of the wafer substrate, and the in-plane resistance value of the wafer is uniform, so that a high-quality thin-film formed wafer substrate can be obtained. The apparatus and the method of the present invention are completely different from the conventional apparatus and method in which the straightening vane disposed in the reactor is designed to have gas holes with uniform opening degree over the overall area so that the uniform flow rate is obtained at the lower side of the straightening vane in the reactor, and it is the first time that they have been proposed by the present invention.

Further, according to a second aspect of the present invention, there is provided a vapor deposition apparatus including plural reaction gas supply ports at the top portion of a hollow reactor, an exhaust gas at the bottom portion thereof, a rotational substrate holder for mounting a wafer substrate in the reactor, and a straightening vane having plural holes at the upper portion of the reactor, and in which the reaction gas is supplied into the reactor to form a thin film on the surface of the wafer substrate on the rotational substrate holder by vapor deposition, characterized in that the hollow inside of the reactor is divided into upper and lower portions which are different in inner diameter, the equivalent inner diameter of the upper portion is set to be smaller than the equivalent inner diameter of the lower portion, the lower end of the upper portion and the upper end of the lower portion are connected to each other by a link portion to make the upper and lower portions of the hollow inside of the reactor continuous with each other, the link portion is provided with a straightening (rectifying) gas flow-out hole, and the rotational substrate holder is located at a position which is lower than the lower end of the upper portion in the lower portion of the reactor by a predetermined height.

In the vapor deposition apparatus of the second aspect of the present invention, it is preferable that a space portion for hermetically enveloping the straightening gas flow-out hole and a straightening gas supply port is provided to the space portion. Further, it is preferable that the side surface of the upper portion is perpendicular to the surface of the rotational substrate holder, and also it is preferable that the space portion and the upper portion are designed in a dual annular shape, and the outer sides surface of the space portion is continuous to the upper end of the lower portion through the link portion. Still further, it is preferable that the horizontal section of the hollow inside of the reactor is circular, the diameter of the upper portion ($D_1$) is larger than the diameter of the wafer substrate, the rotational substrate holder is circular in section and the ratio ($D_1/D_S$) of the diameter of the upper portion and the diameter of the rotational substrate holder ($D_S$) is set to 0.7 to 1.2. Further, it is preferable that the ratio ($D_2/D_1$) of the upper portion diameter ($D_1$) and the lower portion diameter ($D_2$) is set to 1.2 or more, and the ratio ($D_1/D_S$) of the lower portion diameter ($D_2$) and the rotational substrate holder diameter ($D_S$) is set to 1.2 or more. Still further, it is preferable that the height difference (H) between the lower end of the upper portion and the rotational substrate holder is larger than the transition layer thickness (T) of the gas flow above the upper surface of the rotational substrate holder, and the transition layer thickness (T) is a calculated value of $3.22(v/\omega)^{1/2}$ (v represents coefficient of kinematic viscosity ($mm^2/s$), $\omega$ represents an angular velocity of rotation (rad/s)), and a part of the link portion and the upper surface of the rotational substrate holder are in the same horizontal plane.

According to the present invention, there is provided a vapor deposition method using the vapor deposition apparatus of the second embodiment in which the reaction gas containing the thin film forming raw-material gas and the carrier gas are supplied from plural reaction gas supply ports and passed through the straightening vane onto the wafer substrate so that the transition layer thickness (T) of the gas flow at the upper portion of the rotational substrate holder is smaller than the height difference (H) between the lower end of the upper portion and the upper surface of the rotational substrate holder, and at the same time straightening (rectifying) gas is introduced through the straightening gas flow-out hole of the link portion. Further, in the vapor deposition method of the present invention, it is preferable that the rotation of the rotational substrate holder is controlled so that the transition layer thickness (T) which is a calculated value of $3.22(v/\omega)^{1/2}$ (v represents coefficient of kinematic viscosity ($mm^2/s$), $\omega$ represents an angular velocity of rotation (rad/s)) is smaller than the height difference (H), and also it is preferable that the ration ($G_1/G_C$) of the carrier gas flow rate ($G_C$) and the straightening gas flow rate ($G_1$) is set to 0.05 to 2.

In the vapor deposition apparatus and method of the second aspect of the present invention thus constructed, occurrence of eddy flow of gas due to the blow-up phenomenon of the reaction gas which occurs along the wall of the reactor in the conventional vapor deposition apparatus can be suppressed by altering the shape of the reactor so that the diameter of the upper portion is set to be smaller than that of the lower portion, thereby eliminating the space in which the eddy flow occurs. At the same time, the increase of the temperature of the vapor phase at the upper portion of the reactor can be prevented, so that the uniform nucleus formation of the raw-material gas for forming thin films of silicon or the like can be suppressed and thus particles occurring in the vapor phase can be reduced. Therefore, there can be prevented the shortening of the maintenance cycle due to the adhesion of particles to the wall of the reactor, the occurrence of crystal defects due to adhesion of particles to the wafer, and the deterioration in quality of wafers due to direct adhesion of particles thereto. Further, the suppression of occurrence of gas eddy flow enables the gas flow just above the wafer mounted on the rotational substrate holder to smoothly direct from the center of the wafer to the outer peripheral portion in parallel to the wafer surface. Therefore, no re-doping of the dopant in vapor phase at the outer peripheral portion of the substrate occurs, and a high-quality thin-film formed wafer substrate having an uniform in-plane resistance distribution can be obtained. Still further, the upper portion of the reactor is narrowed, and thus the gas flow rate in the direction of the shaft of the rotational substrate holder can be increased by a relatively small amount of carrier gas, so that the carrier gas amount can be reduced as compared with the conventional apparatus.

Further, the straightening gas flow-out hole is provided to the link portion for linking the lower end of the small-diameter upper portion of the reactor and the upper end of the large-diameter lower portion to flow out the straightening gas such as hydrogen or the like at a predetermined flow rate, so that the gas flow which occurs above the rotational substrate holder and directs from the center to the outer peripheral portion is straightened (rectified), and there can be prevented the so-called gas flow disturbance at the diameter-enlarged lower portion at the outer peripheral side of the rotational substrate holder due to the design in which the diameter of the upper portion of the reactor is smaller than the lower portion of the reactor. Accordingly, adhesion of particles to the inner wall of the diameter-enlarged link portion and the lower portion of the reactor, and deposition of thin-film forming components can be prevented. Further, the ratio of the diameter of the upper portion of the reactor, the diameter of the lower portion of the reactor and the diameter of the rotational substrate holder can be set to a predetermined value to thereby preventing the ascent of the gas in the reactor and thus occurrence of particles. At the same time, the occurrence of gas eddy flow and the disturbance of gas flow can be prevented, Still further, the particles adhering to the wall of the reactor can be avoided from falling down onto the wafer substrate on the rotational substrate holder.

Further, the rotational substrate holder is disposed at a position which is lower than the lower end of the upper portion of the reactor (corresponding to the upper end of the link portion at the lower portion of the reactor) by a predetermined height, and particularly the height difference is set to be larger than the transition layer thickness of the gas flow which is formed on the upper surface of the rotational substrate holder. Therefore, the lower end of the upper portion prevents the ascent of the gas without disturbing smooth gas flow, and thus there occurs no gas eddy flow and no disturbance of gas flow, so that high-quality thin-film formed wafer substrates with no crystal defect can be obtained. Further, the vapor deposition method of the present invention uses the apparatus of the second aspect of the present invention, the flow rate of introducing the reaction gas, the flow-out rate of the straightening gas from the link portion, the rotational speed of the rotational substrate holder, etc. are controlled so that the height difference between the upper surface of the rotational substrate holder and the lower portion of the lower end of the upper portion of the reactor is set to be larger than the transition layer thickness of the gas flow which is formed on the rotational substrate holder, whereby high-quality thin film formed wafer substrates with no crystal defect can be obtained.

In the present invention, the transition layer is defined as a gas layer in which raw-material gas stream supplied through the straightening vane flows with a vector directing from the center to the outer peripheral portion on the rotational substrate holder, and the transition layer thickness is defined as the thickness of the gas flow having the vector on the rotational substrate holder.

DETAILED DESCRIPTION OF PREFERRED EMBODIMENTS

Preferred embodiments according to the present invention will be described hereunder with reference to the accompanying drawings.

First, embodiments of a vapor deposition apparatus of a first aspect of the present invention will be described with reference to the accompanying drawings. However, the present invention is not limited to the following embodiments. In the following description, for convenience's sake, a reactor is designed in a hollow cylindrical shape having a circular horizontal section. However, the horizontal sectional shape of the reactor is not limited to a specific shape, and it may be square or the like. Further, the same is applied to a rotational substrate holder. In general, a hollow cylindrical reactor and a disc-shaped rotational substrate holder are favorably used.

Figure 1A:
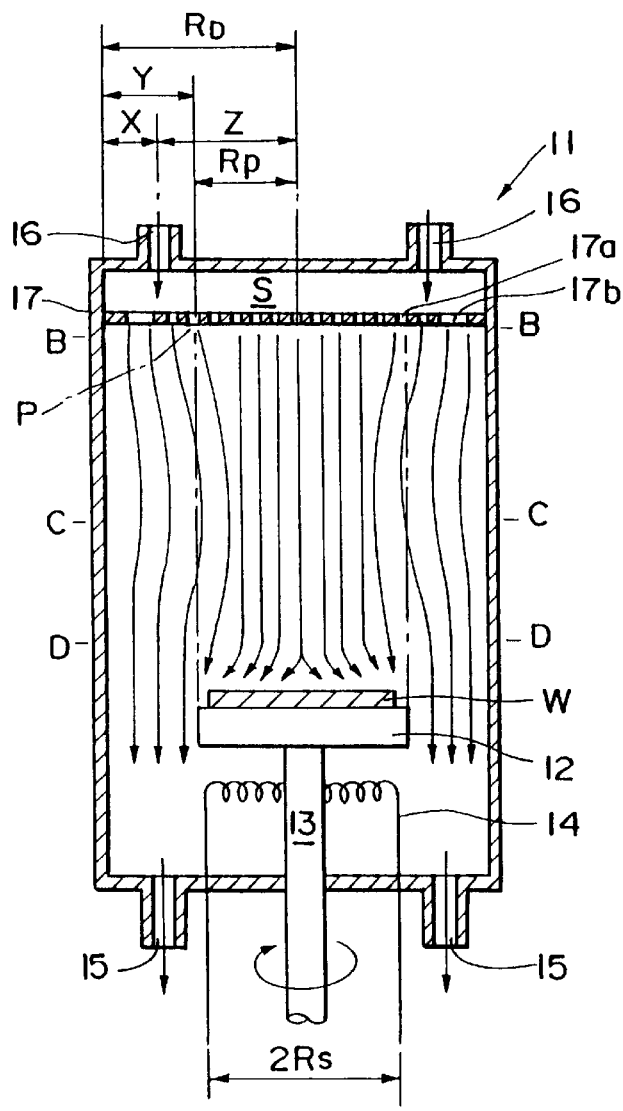
FIG. 1A is a sectional view showing an embodiment of a reactor of a thin film vapor deposition apparatus according to a first aspect of the present invention.
Figure 1B:
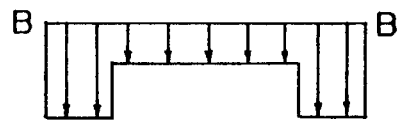
FIGS. 1B to 1D are diagrams showing the gas flow rate distribution in the vertical direction at predetermined positions B, C and D respectively in the apparatus shown in FIG. 1A.
Figure 1C:
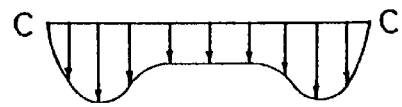
Figure 1D:
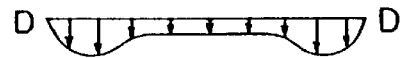
Figure 2:
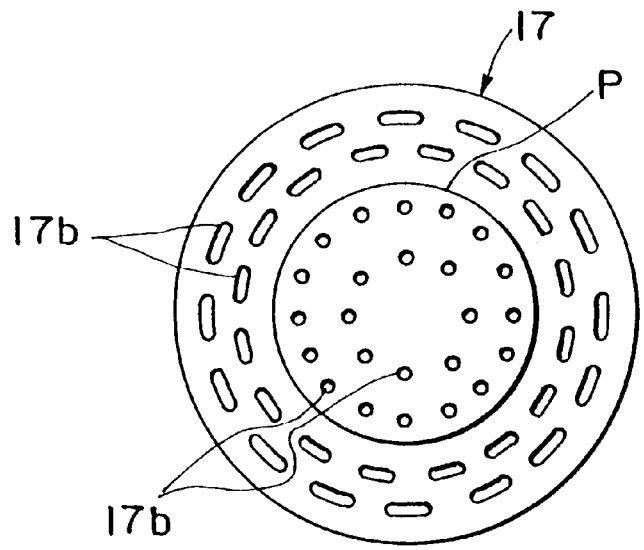
FIG. 2 is a plan view showing a straightening vane used in the reactor of the apparatus of the first aspect of the present invention
Figure 3:
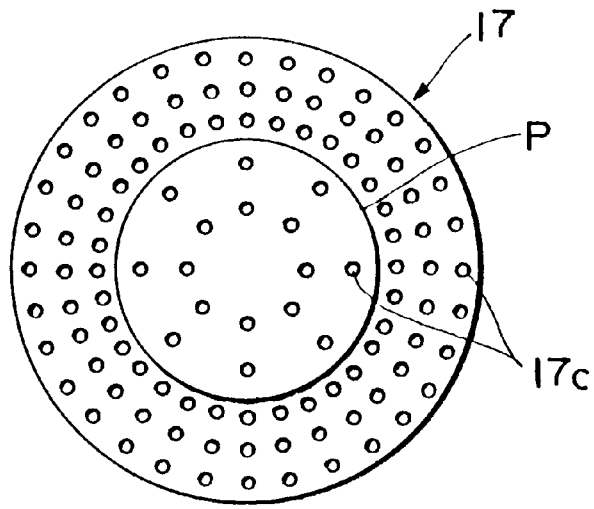
FIG. 3 is a plan view showing another straightening vane.

FIG. 1A is a sectional view showing an embodiment of a thin film vapor deposition apparatus of a first aspect of the present invention, and FIGS. 1B to 1D are diagrams showing the gas flow rate distribution in the vertical direction at predetermined positions B, C and D respectively in the apparatus of FIG. 1A. Arrows of FIG. 1A schematically represent gas streams in the apparatus as in the case of FIG. 14. FIG. 2 is a plan view showing a straightening vane disposed in the apparatus of FIG. 1A.

In FIG. 1A and FIG. 2, a reactor 11 is designed substantially in the same construction as the reactor of the conventional vapor deposition apparatus as described above. That is, a rotator 12 for mounting a wafer substrate W thereon is freely rotatably supported at the lower portion in the reactor by a rotational shaft 13, and a heater 14 for heating the rotator 12 and the wafer substrate W mounted thereon is disposed below the rotator 12. The rotational shaft 13 is connected to a rotating motor (not shown). Further, plural exhaust ports 15 for exhausting non-reacted gas, etc. are disposed at the bottom portion of the reactor 11. At the top portion of the reactor 11 are disposed plural gas supply ports 16 for supplying reaction gas containing raw-material gas such as silane ($SiH_4$), dichlorosilane ($SiH_2Cl_2$) or the like and carrier gas such as hydrogen ($H_2$), argon (Ar), helium (He) or the like. A disc-shaped straightening vane 17 having plural small-diameter gas holes 17a and plural large-diameter gas holes 17b formed therein is disposed at the upper portion in the reactor so as to be spaced from the ceiling portion with keeping a predetermined space area S and so as to be disposed in close contact with the inner peripheral surface of the reactor so that the supplied reaction gas is not drifted.

In the present invention, the straightening vane disposed at the upper portion of the reactor serves to streams the reaction gas introduced from the gas supply ports 16 through the many gas holes 17a and 17b into the reactor. In this case, unlike the conventional straightening vane in which the gas holes have an uniform opening degree, the gas holes of the straightening vane of this embodiment are designed so that the opening degree thereof at a predetermined outer area (X area) is set to be larger than that at the other areas, mainly at the center area (hereinafter merely referred to as "center area" or "Z area"). In this case, the ratio of the opening degree of the outer area (Ox) and the opening degree of the center area (Oz) is preferably set to such a value that the flow rate of the reaction gas after the reaction gas is passed and straightened through the gas holes at each area is equal to a rate (Vx/Vz) as described later. Usually, the gas holes in each area are designed so that the ratio of Ox/Oz is equal to 10 to 2600. No restriction is imposed on the shape and location of the gas holes, and they may be suitably determined in accordance with the shape of the reactor and the reaction conditions. For example, as shown in FIGS. 1A and 2, the opening degree may be varied by forming gas holes which are different in opening diameter. In FIG. 1A and 2, the gas holes 17a having a small diameter are disposed at equal intervals in the center area of the straightening vane 17, and the gas holes 17b having a large diameter are suitably disposed in the outer area. As shown in FIG. 2, the opening portion of each large-diameter gas hole 17b is designed to be elongated in the peripheral direction, however, it may be designed as a circular hole or a square hole. Besides, gas holes 17c having the same shape and the same opening diameter may be formed in the straightening vane so that the number of gas holes per unit area in the outer area is larger than that in the center area to make the opening degree of the outer area larger than that of the center area.

Further, in any case, the gas holes 17a formed in the center area of the straightening vane are disposed substantially at equal intervals so that the reaction gas passing through the gas holes 17a of the center area is straightened (rectified) and flows down onto the surface of the wafer substrate W on the rotational substrate holder 12 at an uniform flow rate.

In the straightening vane of the apparatus of this embodiment, the outer area having a larger opening degree represents an area which is located at the outside in the radial direction of the outer peripheral edge P of the orthogonal projection shape obtained by orthogonally projecting the rotational substrate holder 12 disposed at the lower portion of the reactor. That is, the radius $R_P$ of the orthogonal projection shape obtained by orthogonally projecting the disc-shaped rotational substrate holder 12 is equal to the radius (Rs) of the rotational substrate holder 12 The boundary between the outer area and the center area is set to be equal to or smaller than the difference Y ($=R_D-R_P$) of the radius $R_D$ of the straightening vane and the radius $R_P$ of the orthogonal projection shape. That is, when the boundary between the outer area and the center area has an interval distance (width) X from the wall of the reactor which is in close contact with the straightening vane and a distance Z from the center of the straightening vane, $X \leq Y$. Accordingly, if $X=Y$, $Z=R_P$, and the boundary is coincident with the outer peripheral edge P of the orthogonal projection shape. If $X<Y$, $Z>R_P$, and the boundary is located at the outside in the radial direction of the outer peripheral edge P. Further, the ratio of the interval width X of the outer area and the difference Y is set to 0.02 to 1.0 ($0.02 \leq X/Y \leq 1.0$), and preferably to 0.05 to 0.5. If X/Y is smaller than 0.02, the gas flows up along the wall of the reactor, that is, the blow-up phenomenon of gas flow occurs, and occurrence of gas eddy flow cannot be prevented. On the other hand, if X/Y exceeds 1.0, the outer area having the large-diameter gas holes 17b (i.e., having the larger opening degree) invades into the orthogonal projection shape of the rotational substrate holder 12, and reaction gas flow having an uniform flow rate distribution cannot be obtained in the gas flow path extending to the rotational substrate holder in the reactor, so that any high-quality thin-film formed wafer substrate with no crystal defect cannot be obtained.

In the vapor deposition apparatus of the first aspect of the present invention, the gas holes are formed in the straightening vane disposed at the upper portion in the reactor so that the opening degree at the outer area (X area) is larger than the opening degree at the center area (Z area), and the gas holes in the center area are uniformly arranged so that the reaction gas passing through the gas holes flows down at a uniform flow rate. Accordingly, the reaction gas which is introduced through the plural gas supply ports 16 at the top portion of the reactor is passed and straightened (rectified) through each gas hole of the straightening vane 17, and at the same time the reaction gas flows down at different flow rates between the X area and the Z area. Further, the boundary between the X area having the larger opening degree and the Z area having the smaller opening degree is positionally substantially coincident with the outer peripheral edge P of the orthogonal projection shape obtained by orthogonally projecting the rotational substrate holder, or located at the outside of the outer peripheral edge P toward the wall of the reactor. Therefore, the reaction gas passing through the gas holes 17a which are uniformly arranged substantially above the rotational substrate holder toward the center side from the outer peripheral edge P of the orthogonal projection shape flows down onto the surface of the wafer substrate on the rotational substrate holder 12 at a predetermined uniform flow rate (flow amount). In addition, the reaction gas passing through the gas holes 17b in the X area which is located at the outside of the outer peripheral edge P of the orthogonal projection shape flows though the gas holes 17b at a flow amount larger (at a flow rate higher) than that of the Z area because the opening degree of the X area is higher than that of the Z area.

By using the vapor deposition apparatus of the first aspect of the present invention thus constructed, the wafer substrate W is mounted on the rotational substrate holder 12, and then the inside of the reactor 11 is evacuated by the exhaust control device which is connected to the exhaust ports 15. Thereafter, the raw-material gas such as silane gas, etc. is supplied into the reactor to adjust the inner pressure of the reactor to 20 to 50 torr. Further, the motor is actuated to rotate the rotational shaft 13 and thus the rotational substrate holder 12, and at the same time the wafer substrate W on the rotational substrate holder 12. At the same time, the wafer substrate W on the rotational substrate holder 12 is heated to about 900 to 1200 degrees Celsius by the heater 14. Further, at the same time, the reaction gas containing the raw-material gas and the carrier gas is supplied into the space area S in the reactor 11 while controlling the flow amount of the gas supplied from the gas supply ports 16. The gas stream which is supplied from the plural gas supply ports 16 into the space area S is uniformed in momentum and pressure distribution, and further flows down while passed and straightened (rectified) through the plural gas holes 17a and 17b which are formed in the straightening vane 17 with the opening degrees corresponding to the respective areas. Further, the reaction gas passed through the straightening vane flows at a flow rate which is determined by the amount of the gas thus supplied and the opening degree of the straightening vane. Further, as described above, in the Z area extending from the outer peripheral edge P of the orthogonal projection shape of the rotational substrate holder to the center of the rotational substrate holder, the gas holes 17a having the same diameter are arranged at equal intervals, so that the reaction gas flows down onto the wafer substrate at the substantially uniform gas flow to uniform form a homogeneous thin film on the wafer substrate by vapor deposition.

As described above, the flow rate of the reaction gas passing through the straightening vane of the reactor is varied between the outer area (X area) and the center area (Z area) which are different in opening degree with the outer peripheral edge P of the orthogonal projection shape of the rotational substrate holder at the boundary thereof, so that the gas flow rate distribution has a gradient in the reactor. For example, as show in the gas stream distribution diagrams of FIGS. 1A to 1D, the reaction gas flows at a larger gas flow amount and thus flows down substantially vertically at a high flow rate in the X area having the larger opening degree which is near to the inner wall of the reactor. This high flow-rate gas flow which is formed around the inner wall of the reactor can suppress the blow-up phenomenon (i.e., the ascent of the gas stream along the inner wall of the reactor) which is observed in the conventional reactor, and thus occurrence of gas eddy flow can be prevented. Further, the increase of the vapor-phase temperature in the reactor can be prevented because the heated gas does not ascend. Therefore, the uniform nucleus formation of the thin-film formed components of the raw-material gas in the reaction gas can be suppressed, and the particles occurring in the vapor phase in the reactor can be reduced. Accordingly, there can be prevented the disadvantages of the conventional method that the particles occurring in vapor phase adhere to the wall of the reactor, resulting in shortening of the maintenance cycle, the particles adhere to a wafer to induce crystal defects, and the particles acts as adhesive particles to directly reduce the quality of the wafer.

Further, when the reaction gas which is supplied through the Z area at the center side of the straightening vane passes through the gas holes 17a which have the smaller opening degree than the X area and are substantially uniformly arranged, the reaction gas at the center area flows substantially vertically down and is supplied onto the wafer substrate at an uniform flow rate which is more moderate than the flow rate of the reaction gas at the X area, thereby an uniform thin film can be formed as in the case of the conventional method. As shown in FIG. 1A, the gas flow at the outermost peripheral portion of the Z area is effected by the reaction gas in the X area which flows at a larger flow rate because this portion is adjacent to the X area, and thus the gas stream at this portion is bent toward the center side as if it is pressed. However, since no gas blow-up phenomenon and no occurrence of gas eddy flow occur in the X area around the inner wall of the reactor, the reaction gas at this portion subsequently flows in the radial direction along the wafer substrate as if it is sucked by the gas stream flowing in the X area together with the reaction gas flowing down substantially vertically in the center portion of the Z area to form the gas flow transition layer, and finally flows to the exhaust ports 15. Accordingly, the gas flow in the radial direction is not disturbed, but smoothened on the wafer substrate, and the gas flows uniformly from the center of the wafer substrate to the outer peripheral portion. Therefore, the dopant can be prevented from being re-doped at the outer peripheral portion of the wafer substrate. Accordingly, the in-plane resistance distribution of the wafer substrate on which a uniform thin film is formed by vapor deposition is also uniform, so that a high-quality wafer substrate can be obtained.

Here, when Vx represents the flow rate of the reaction gas flowing through the gas holes in the outer area (X area) of the straightening vane and Vz represents the flow rate of the reaction gas flowing through the gas holes in the other area (Z area), Vx is set to be larger than Vz by adjusting the opening diameter of the gas holes of the straightening vane and the number of arranged gas holes to suitable values to set the opening degree to a prescribed value. Preferably, the ratio (Vx/Vz) of the flow rate Vz in the X area and the flow rate Vz in the Z area is set to 5 to 30, preferably to 10 to 20. If the flow rate ration is less than 5, the blow-up phenomenon of the gas flow (i.e., the ascent of the gas flow along the wall of the reactor) and the gas eddy flow occur, and thus this condition is unfavorable. On the other hand, if the flow rate ratio is more than 30, the gas flow rate of the reaction gas in the X area (outer area) around the wall of the reactor is excessive to disturb the gas flow which forms the transition layer in the area extending from the center of the rotational substrate on the rotational substrate holder to the outer peripheral portion. Therefore, this condition is also unfavorable. In the present invention, it is preferable that the gas flow rate of the Z area is generally set to 0.05 to 0.7 m/s. If the gas flow rate is less than 0.05 m/s, not only the gas flow at the outermost portion of the Z area on the rotational substrate holder which is adjacent to the X area is pressed to the center side, but also the gas flow from the center to the outer peripheral portion of the rotational substrate on the rotational substrate holder is disturbed, and thus this condition is also unfavorable. Further, if the gas flow rate exceeds 0.7 m/s, no more effect is obtained.

In the conventional vapor deposition apparatus, the reaction gas flows onto the wafer substrate at a relatively high flow rate of 0.7 to 1.0 m/s. On the other hand, in the vapor deposition apparatus of the present invention, the reaction gas flows onto the wafer substrate at a flow rate of 0.7 m/s or less, and thus the gas blow-up phenomenon and the gas eddy flow which occur in the conventional method can be prevented. Therefore, it is unnecessary to flow a large amount of carrier gas, and this is extremely industrially practical. In this case, the gas flow rate of the X area may be suitably set in accordance with the ratio (Vx/Vz).

Figure 4:
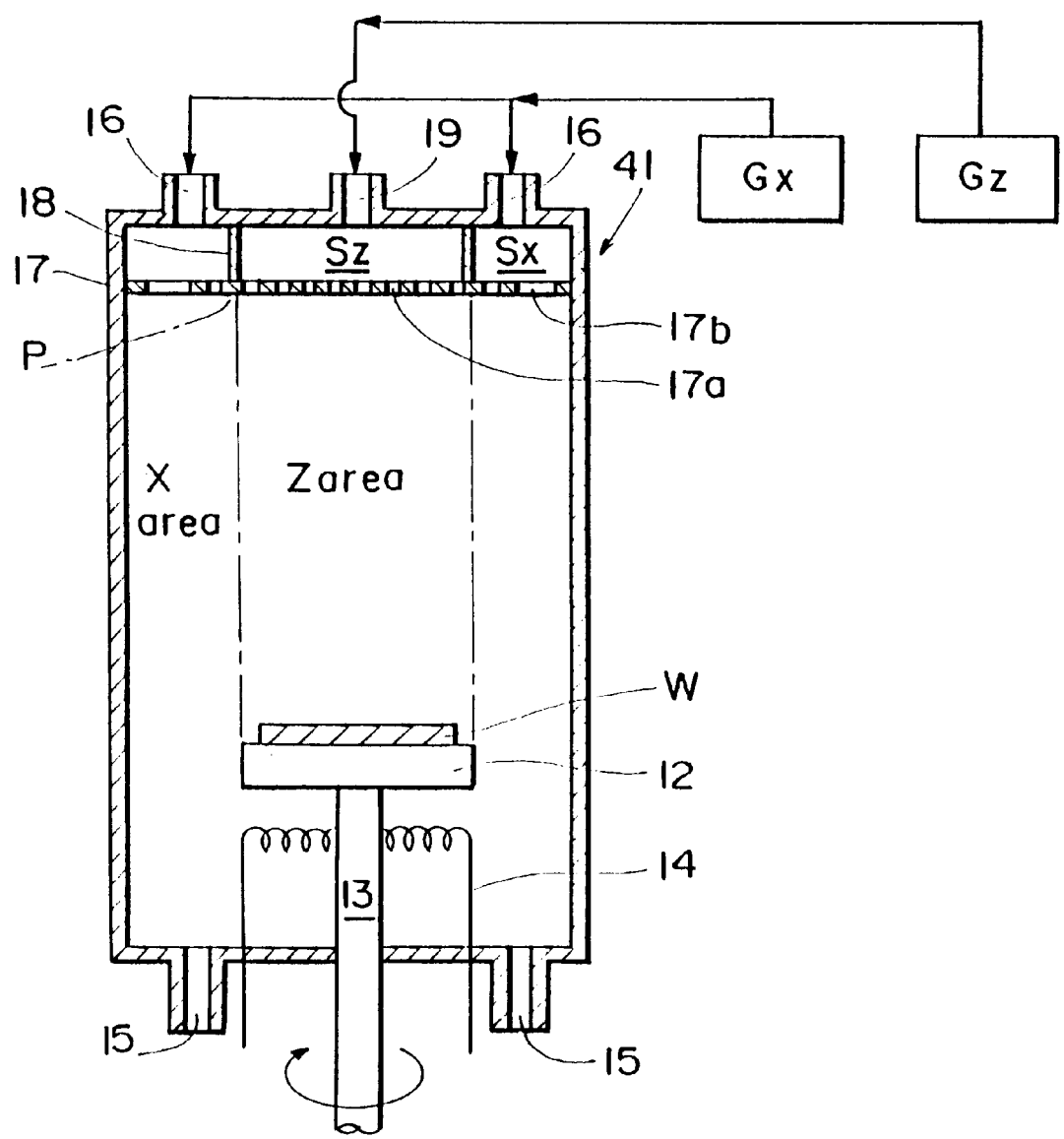
FIG. 4 is a sectional view showing another embodiment of the apparatus of the first aspect of the present invention.

FIG. 4 is a sectional view showing another embodiment of the vapor deposition apparatus of the present invention. In FIG. 4, the vapor deposition apparatus of this embodiment is designed in the same construction as the apparatus of FIG. 1 except that the space area which is formed by the ceiling portion and the straightening vane 17 at the upper portion in the reactor 41 is divided into a peripheral space area Sx and a center space area Sz by a partition plate 18. The same members as shown in FIG. 1A are presented by the same reference numerals, and the duplicative description thereof is omitted.

The partition plate 18 is disposed at the boundary between the outer area (X area) in which the opening degree of the straightening vane shown in FIG. 1A is varied and the other area, that is, at the boundary between the outer area (X area) in which the opening degree is larger and the flow rate of the reaction gas is higher, and other area (Z area) at which the opening degree is smaller and the flow rate of the reaction gas is lower, and the interval width from the peripheral wall of the reactor in the outer area is set to the same as described above. Usually, the partition plate 18 is located near to the outer peripheral edge P of the orthogonal projection shape of the rotational substrate holder 12 to the straightening vane 17. The space area Sx and the space area Sz are separately provided with gas supply ports 16 and a gas supply port 19 respectively. Further, the gas supply ports 16 and the gas supply port 19 are separately connected to different gas supply systems Gx and Gz respectively. Accordingly, the space areas Sx and Sz which are sectioned by the partition plate 18 are separately supplied with the reaction gas containing the raw-material gas, the carrier gas, etc. In short, the reaction gas may be supplied while varying the type of the reaction gas, the mixing ratio if the reaction gas is mixed gas, various supply conditions such as the temperature, pressure, gas flow amount, etc. at the gas supply time. For example, in FIG. 4, the straightening plate 17 is provided with the large-diameter gas holes 17b in the X area and the small-diameter gas holes 17a in the Z area so that the opening degree of the straightening vane is varied with the partition plate 18 at the boundary as in the case of FIG. 1A. Further, in this system, the gas holes may be formed to have a uniform opening degree over the overall area of the straightening vane 17, and the reaction gas containing the thin-film forming raw-material gas and the carrier gas are supplied into the space areas Sx and Sz partitioned by the partition plate 18 at different gas flow amounts (rates) respectively by the gas supply systems Gx and Gz so that after the reaction gas passes through the straightening vane 17, the gas flow rate in the X area of the reactor is higher than that in the Z area. Further, only the carrier gas may be passed through the X area.

Figure 5:
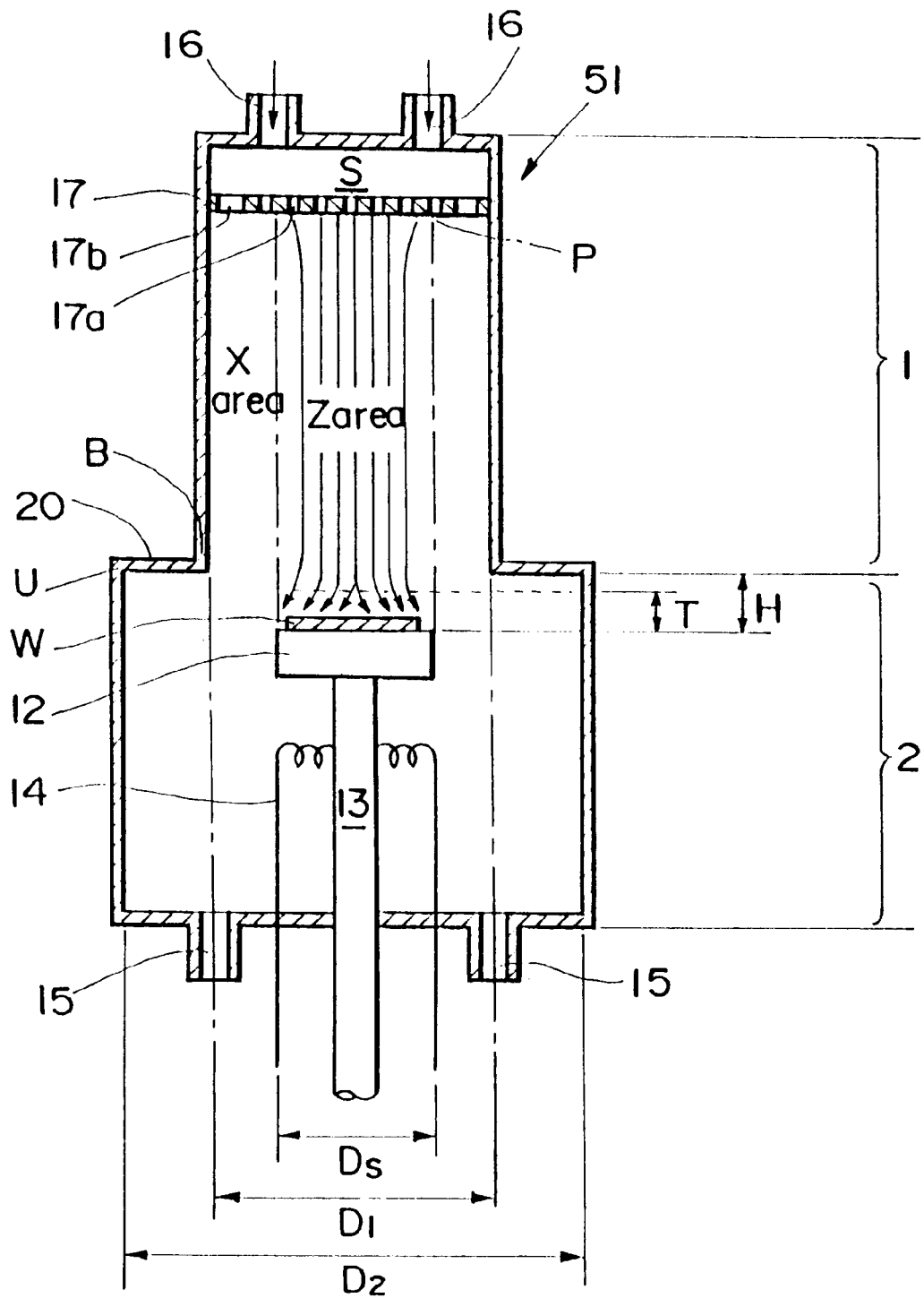
FIG. 5 is a sectional view showing another embodiment of the apparatus of the first aspect of the present invention.

FIG. 5 is a sectional view showing another embodiment of the vapor deposition apparatus of the first aspect of the present invention. In FIG. 5, the apparatus of this embodiment is designed in the same construction as the apparatus of FIG. 1A except that the inside of a hollow reactor 51 is divided into an upper portion 1 and a lower portion 2, and the upper portion 1 and the lower portion 2 are designed so that the upper portion 1 is narrower than the lower portion 2, the inner diameter $D_1$ of the upper portion is set to be smaller than the inner diameter $D_2$ of the lower portion ($D_1 < D_2$), and the upper end portion U of the large-diameter lower portion 2 and the lower end portion B of the small-diameter upper portion 1 are connected to each other by a link portion 20 so that the inside space of the reactor is continuous over the upper and lower portions. The same members as shown in FIG. 1A are represented by the same reference numerals, and the duplicative description thereof is omitted.

In the reactor 51 of FIG. 5, the rotational substrate holder 12 is disposed so that the upper surface thereof is located at a position lower than the lower end B of the upper portion of the reactor by a predetermined height (H). The side wall surface of the upper portion 1 of the reactor is usually formed in parallel to the side wall surface of the lower portion 2 and vertically to the upper surface of the rotational substrate holder 12. The link portion 20 between the lower end B of the upper portion and the upper end U of the lower portion is usually formed in the horizontal direction. However, it is not limited to this arrangement. For example, it may be formed in a slant or curved-surface shape. In the reactor 51 thus constructed, as in the case of the reactor 11 of FIG. 11, the gas flow rate in the outer area (X area) in the reactor is set to be higher with the outer peripheral edge portion P of the orthogonal projection shape to the straightening vane 17 of the rotational substrate holder 12, thereby preventing occurrence of the blow-up phenomenon of the gas flow and the gas eddy flow. In addition, since the inner diameter $D_1$ of the upper portion 1 of the reactor is narrower than the inner diameter $D_2$ of the lower portion, the blow-up phenomenon of the ascending gas flow can be further suppressed, and the occurrence of the particles in vapor phase can be synergistically suppressed, so that the adhesion of the particles to the inner wall of the reactor and the effect of the adhering particles on the wafer substrate can be prevented. Therefore, the quality of the thin-film formed wafer substrate is improved, the maintenance cycle is lengthened, and this provides remarkable industrial advantages.

In the reactor of FIG. 5, it is preferable that the inner diameter $D_1$ of the upper portion of the reactor, the inner diameter $D_2$ of the lower portion and the diameter $D_S$ of the rotational substrate holder 12 have the following relationship. For example, $D_1$ is larger than the diameter of the wafer, and (1) $D_2/D_1$ is equal to 1.2 or more ($D_2/D_1 \geq 1.2$). If $D_1$ is smaller than the diameter of the wafer, the particles which fall down from the inner wall surface of the upper portion 1 of the reactor are liable to adhere to the wafer substrate mounted on the rotational substrate holder 12, so that there is such a trend that crystal defects measured as LPD (wafer surface laser scatterer) increase. Further, it is difficult to perform a contactless temperature measurement based on infrared ray on the outer peripheral portion of the wafer substrate which is usually performed in the vapor deposition process. On the other hand, if $D_2/D_1$ is larger than 1.2, the blow-up phenomenon of the ascending gas flow can be suppressed eve when the gas flow rate between the X area and the Z area is relatively small. (2) the $D_1/D_S$ ratio is equal to 0.7 to 1.2 ($0.7 \leq D_1/D_S \leq 1.2$). If the $D_1/D_S$ ratio is equal to 0.7 to 1.2, the blow-up phenomenon of the ascending gas flow can be suppressed even when the gas flow ratio between the X area and the Z area in the reactor is relatively small. If $D_1/D_S$ is smaller than 0.7, the side surface of the upper portion 1 is excessively proximate to the wafer substrate mounted on the rotational substrate holder 12, and the particles which fall down from the inner wall surface of the reactor are liable to adhere to the wafer substrate. Therefore, as in the case where $D_1$ is smaller than the diameter of the wafer substrate, the crystal defects measured as LPD are increased, and the quality of the thin-film formed wafer substrate is reduced. On the other hand, if $D_1/D_S$ is larger than 1.2, no further effect can be improved. (3) The $D_2/D_S$ is equal to 1.2 or more ($D_2/D_S \leq 1.2$). If $D_2/D_S$ is smaller than 1.2, the gas stream in the Z area which flows above the rotational substrate holder 12 hardly flows to the exhaust pipes smoothly. Therefore, the particles adhere to the inner wall of the reactor confronting the outside of the rotational substrate holder 12, and the non-reacted gas is reacted at the lower side of the rotational substrate holder 12 to promote deposition of the thin-film formed components on the inner wall of the lower portion 2 of the reactor, thereby shortening the maintenance cycle.

Further, in the reactor 51 of FIG. 5, the upper surface of the rotational substrate holder 12 is located at a position lower than the lower end B of the upper portion 1 of the reactor by a predetermined height difference H. The height difference H is usually preferably set to be larger than the thickness of a transition layer formed by the gas flow in the Z area above the rotational substrate holder 12, that is, the thickness (T) of the gas layer of the gas flow of the raw-material gas, etc. which are passed through the gas holes 17a of the straightening vane 17 as indicated by arrows in FIG. 5 and has a vector directing from the center to the outer peripheral side above the rotational substrate holder 12. If the height difference H is smaller than the transition layer thickness T, the gas stream which flows from the center of the wafer substrate W in the radial direction above the rotational substrate holder 12 is disturbed by the lower end B of the upper portion 1 of the reactor, and thus the blow-up phenomenon of the ascending gas flow along the side surface of the upper portion 1 of the reactor occurs to thereby promote occurrence of gas eddy flow. Further, the upper surface of the rotational substrate holder 12 is preferably in parallel to the link portion 20 between the upper portion 1 and the lower portion 2 of the reactor.

Further, the transition layer thickness T of the gas flow above the rotational substrate holder 12 is varied mainly in accordance with the type of the atmospheric gas in the reactor, the pressure in the reactor and the rotational number of the rotational substrate holder in a general reactor which has been hitherto used, and it can be calculated from the following equation (1). The equation (1) is generally introduced on the basis of hydrodynamics:

$$T = 3.22(v/\omega)^{1/2} \quad (1)$$

(v represents coefficient of kinematic viscosity (mm²/s), ω represents an angular velocity of rotation (rad/s)). In this case, the minimum value in the thin film forming process of the vapor deposition apparatus is used as ω. For example, when silane gas is used as the raw-material gas, hydrogen gas is used as the carrier gas and the rotational number of the rotational substrate holder is set to 500 to 2000 rpm (52 to 209 rad/s), the transition layer thickness T is equal to about 5 to 50 mm. Accordingly, it is preferable that the rotational substrate holder is located so that the upper surface thereof is located at a position lower than the lower end B of the small-diameter upper portion 1 of the reactor by a height difference H which is larger than the T value, whereby the gas stream from the center to the outer periphery above the wafer substrate is further smoothed, and there occurs no adhesion of particles of thin-film forming raw material, so that a uniform thin-film formed wafer having no crystal defect can be formed.

Figure 6:
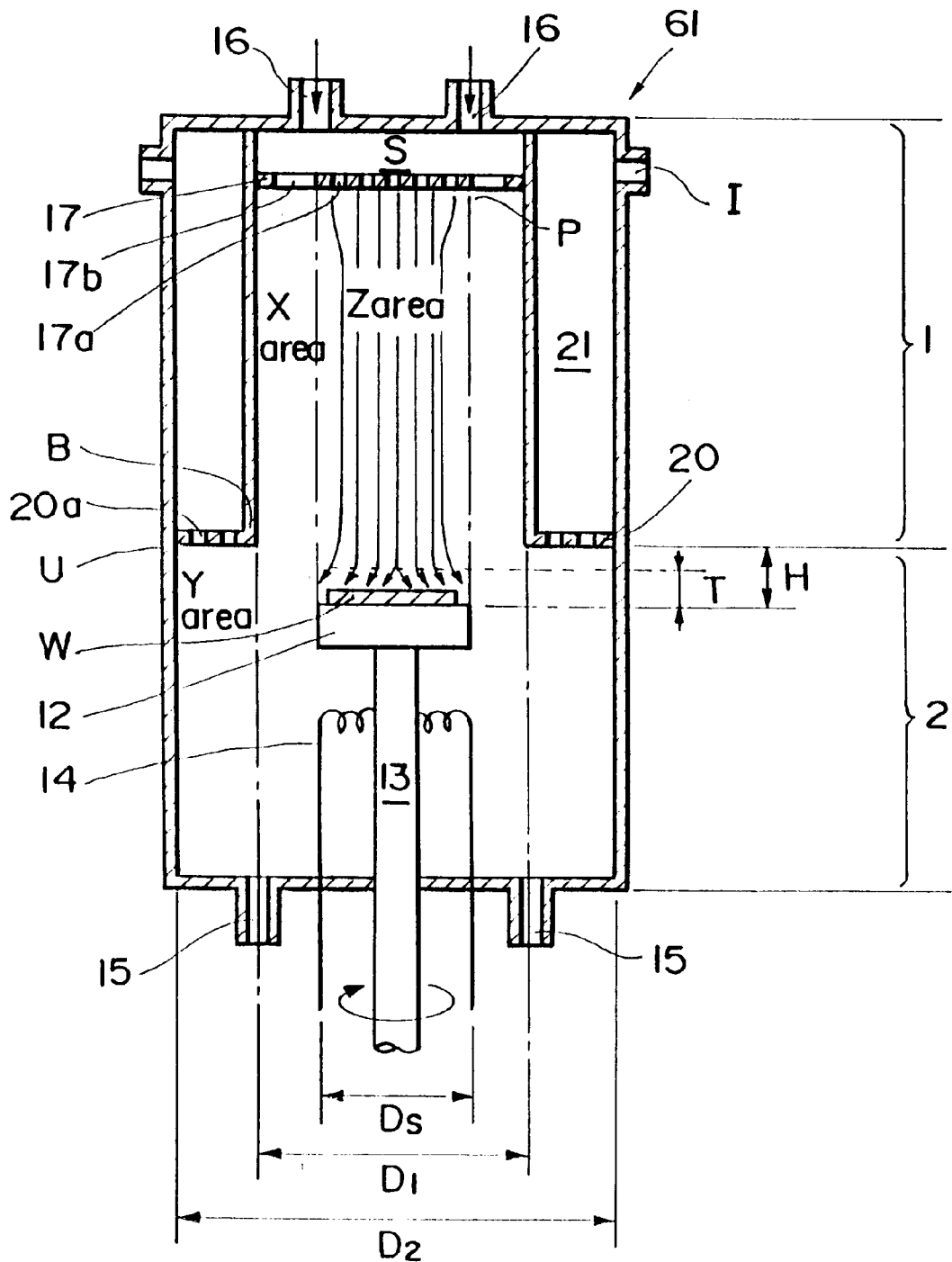
FIG. 6 is a sectional view showing another embodiment of the apparatus of the first aspect of the present invention.

FIG. 6 is a sectional view showing another embodiment of the vapor deposition apparatus of this aspect of the present invention. The apparatus of FIG. 6 has the same construction as the apparatus of FIG. 6 except for the following construction. That is, a reactor 61 is divided into a small-diameter upper portion and a large-diameter lower portion 2, and the link portion 20 between the upper portion 1 and the lower portion 2 is provided with plural straightening (rectifying) gas flow-out holes 20a through which straightening (rectifying) gas flows out. In addition, the upper portion 1 of the reactor is designed in a dual structure so that the link portion 20 having the straightening gas flow-out holes 20a is hermetically enveloped by a hollow annular portion 21, and straightening gas supply ports I are provided to the hollow annular portion 21. The same members as shown in FIG. 5 are represented by the same reference numerals, and the duplicative description thereof is omitted.

In the reactor 51 of FIG. 6, the straightening gas for making the non-reacted gas smoothly flow into the exhaust ports 15 may be supplied through the straightening gas flow-out holes 20a which are formed in the link portion 20. The carrier gas is generally used as the straightening gas, and the same gas as the carrier gas which is usually introduced through the gas supply ports 16 of the reactor is supplied. The flow of the straightening gas enables the non-reacted gas to flow to the outer peripheral side of the rotational substrate holder 12 and then be exhausted from the exhaust ports 15 without any gas eddy flow and any gas flow disturbance by a synergistic effect with the high-speed reaction gas in the X area after the reaction gas reaches the wafer substrate W to be supplied for the thin film growth (vapor deposition), so that there occurs no deposition of the thin-film forming components at the lower portion of the reactor and thus the maintenance cycle of the reactor can be lengthened.

In the reactor 61 of FIG. 6, the ratio ($V_1/V_X$) of the flow rate ($V_X$) of the reaction gas in the X area and the flow rate ($V_1$) of the straightening gas from the straightening gas flow-out hole 20a is preferably set to 0.05 to 2 ($0.05 \leq V_1/V_X \leq 2$). By flowing the straightening gas from the straightening gas flow-out hole 20a of the link portion 20- so that the ratio $V_1/V_X$ is set in the above range, the flow of the reaction gas above the rotational substrate holder and the flow of the non-reacted gas into the space at the lower portion of the reactor from the outer peripheral side of the rotational substrate holder are smoothed without any gas eddy flow and any gas flow disturbance, so that a high-quality homogeneous thin-film formed wafer substrate having little crystal defect can be obtained. On the other hand, if $V_1/V_X$ is less than 0.05, no effect cannot be obtained even by introducing the straightening gas from the straightening gas flow-out hole 20a at the large-diameter portion at the lower portion of the reactor which is located at the outside of the rotational substrate holder. Further, if $V_1/V_X$ exceeds 2, the gas flow rate at the large-diameter portion at the outside of the rotational substrate holder 12 is excessively high, and thus the smooth gas flow from the center to the outer peripheral portion on the rotational substrate holder is disturbed, so that any homogeneous thin film having a uniform thickness cannot be grown.

Next, preferred embodiments of a vapor deposition apparatus of a second aspect of the present invention will be described.

Figure 7:
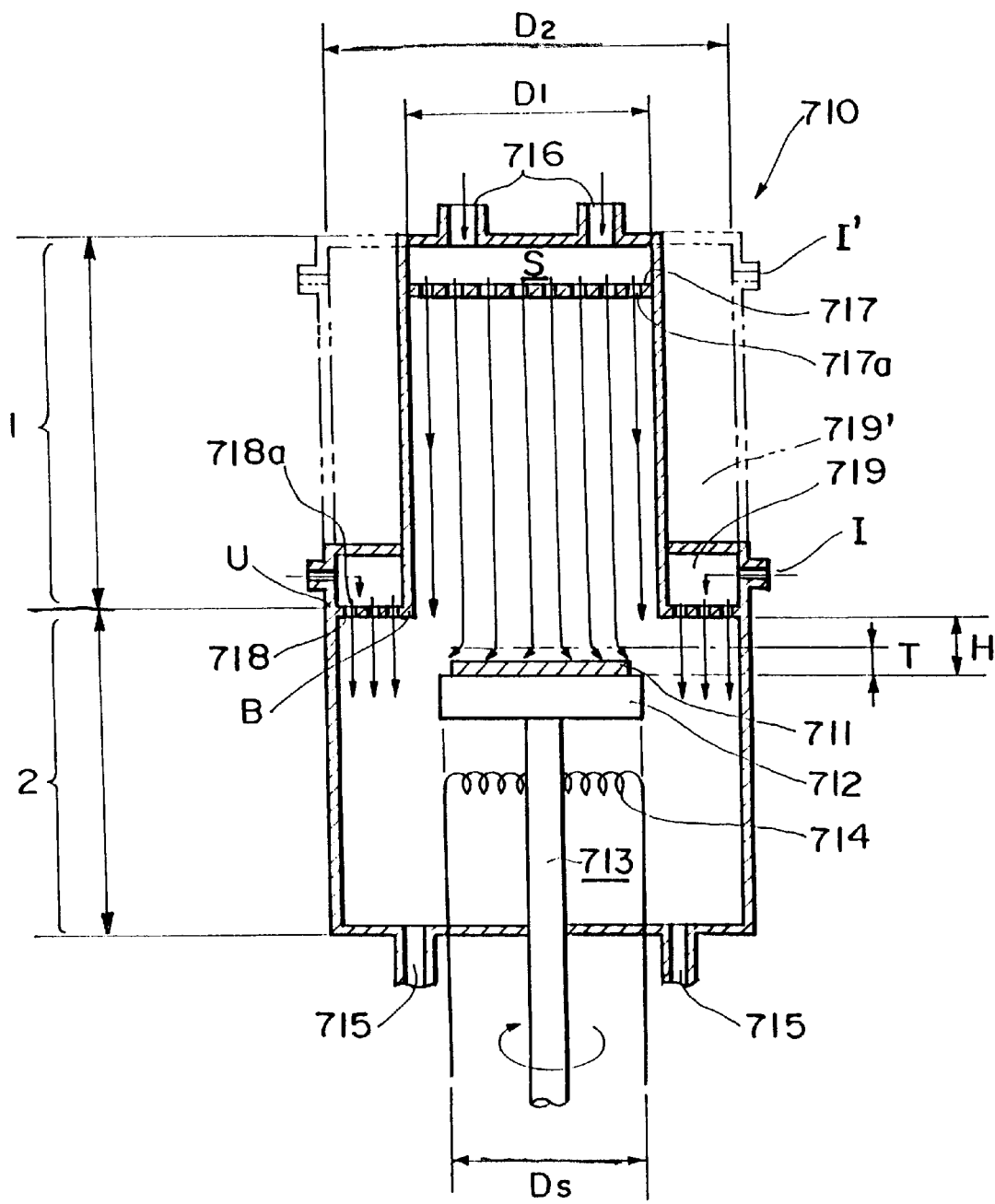
FIG. 7 is a sectional view showing an embodiment of a thin film vapor deposition apparatus of a second aspect of the present invention.

FIG. 7 is a sectional view showing an embodiment of the vapor deposition apparatus of the second aspect of the present invention.

In FIG. 7, a reactor 710 is sectioned into an upper portion 1 and a lower portion 2, and the upper portion 1 is designed to be narrower than the lower portion 2. That is, the inner diameter $D_1$ of the upper portion 1 is set to be smaller than $D_2$ ($D_1 < D_2$). No restriction is imposed on the ratio of the height $H_1$ of the upper portion and the height $H_2$ of the lower portion, that is, the section rate of the reactor. The section rate of the reactor may be set to such a suitable value that the rotational substrate holder, etc. can be disposed at the lower portion 2. Usually, the ratio $H_{1/2}$ is set to 0.5 to 2.0. The upper end portion U of the large diameter lower portion 2 and the lower end portion B of the small-diameter upper portion 1 are linked to each other by a link portion 718, and however, the hollow inner space of the reactor is continuous over the upper and lower portions although the upper and lower portions are different in inner diameter. Further, the side wall surface of the upper portion 1 of the reactor is usually vertically formed in parallel to the side wall surface of the lower portion 2 and also vertically to the upper surface of the rotational substrate holder. The link portion 718 between the lower end B of the upper portion 1 and the upper end U of the lower portion 2 is usually formed horizontally, however, it is not limited. For example, it may be formed in a slant or curved-surface shape. The link portion 718 of the reactor is provided with plural straightening gas flow-out holes 718a for through which the straightening gas flows out.

In FIG. 7, a rotational substrate holder 712 for mounting a wafer substrate 711 is freely rotatably supported by a rotational shaft 713 at the large-diameter lower portion 2 of the reactor, and a heater 714 for heating the rotational substrate holder 712 and the wafer substrate 711 mounted thereon is provided at the lower side of the rotational substrate holder 712. The rotational substrate holder 712 is located at a lower position so as to keep a predetermined height difference (H) from the lower end B of the upper portion of the reactor. The rotational shaft 713 is connected to a rotating motor (not shown). Further, plural exhaust ports 715 for exhausting non-reacted gas, etc. are provided at the bottom portion of the reactor 710. Further, plural reaction gas supply ports 716 are provided at the top portion of the upper portion 1 of the reactor, and reaction gas containing raw-material gas of silane ($SiH_4$), dichlorosilane ($SiH_2Cl_2$) or the like and carrier gas such as hydrogen ($H_2$), helium (He), argon (Ar) or the like are introduced from the reaction gas supply ports 716. A disc-shaped straightening vane 717 having plural holes 717a formed therein is provided at the upper side of the upper portion 1 of the reactor so as to keep a predetermined space area S from the top portion of the reactor and be in close contact with the inner peripheral surface of the upper portion of the reactor so that the supplied gas does not form any drift path.

Further, the straightening gas for making smooth the flow of the non-reacted gas to the exhaust ports 715 is introduced from the straightening gas flow-out holes 718a formed in the link portion 718. The carrier gas is generally used as the straightening gas. Usually, the same gas as the carrier gas supplied from the gas supply ports 716 at the top portion of the reactor is introduced. Accordingly, after the reaction gas reaches the wafer substrate 711 to be supplied for the growth of a thin film, the non-reacted gas can smoothly flow out from the outer peripheral side of the rotational substrate holder 712 and be exhausted from the exhaust ports 715 without producing any gas eddy flow and any gas flow disturbance. No restriction is imposed on the way of introducing the straightening gas from the straightening gas flow-out ports 718a insofar as the straightening gas can be uniformly introduced from each of the straightening gas flow-out holes 718a. For example, an introducing pipe may be provided to each straightening gas flow-out hole 718 to individually introduce the straightening gas from each hole 718. Further, as shown in FIG. 7, the straightening gas flow-out holes 718a may be hermetically enveloped on the link portion 718 to provide a straightening gas introducing space portion 719 having straightening gas supply ports I and supply the straightening gas into the straightening gas introducing space portion 719. In this case, like a straightening gas introducing space portion 719' having a straightening gas supply port I',the overall area of the outer peripheral surface of the upper portion 1 of the reactor may be enveloped to design the upper portion of the reactor 710 in a dual structure so that the upper portion 1 of the reactor is set as a hollow inner portion and the hollow annular portion is set as the straightening gas introducing space portion. The dual annular structure is preferable because it is simple to manufacture a reactor.

In the vapor deposition apparatus of this aspect of the present invention, the rotational substrate holder 712 is disposed so that the upper surface thereof is located at the lower side of the lower end B of the upper portion 1 of the reactor at a predetermined height difference (H). The height difference H is usually set to be larger than the transition layer thickness of the gas flow supplied to the upper portion of the rotational substrate holder 712, that is, the thickness (T) of the gas layer which is formed by the gas flow of raw-material gas, etc. supplied through the straightening vane 717 as indicated by arrows of FIG. 7, the gas flow having a vector directing from the center to the outer peripheral side portion above the rotational substrate holder 712, If the height difference H is less than the transition layer thickness T, the gas flow directing from the center to the outer peripheral portion of the wafer substrate 711 on the rotational substrate holder 712 is disturbed by the lower end B of the upper portion 1 of the reactor, and the upward blow-up phenomenon of the gas flow along the inner wall of the reactor occurs to promote occurrence of gas eddy flow, so that the amount of deposits on the link portion 718 and the inner wall of the lower portion 2 of the reactor is increased. Further, it is preferable that the upper surface of the rotational substrate holder 712 is on the same horizontal plane as the link portion 718 between the upper portion 1 and the lower portion 2 of the reactor.

The transition layer thickness T of the gas flow above the rotational substrate holder 712 is varied in accordance with the type of the atmospheric gas in the reactor, the inner pressure in the reactor and the rotational number of the rotational substrate holder in a general conventional reactor, and it can be calculated from the following equation (1). The equation (1) is generally introduced on the basis of hydrodynamics:

$$T=3.22(v/\omega)^{1/2} \quad (1)$$

(v represents coefficient of kinematic viscosity (mm$^2$/s), $\omega$ represents an angular velocity of rotation (rad/s)). In this case, the minimum value in the thin film forming process of the vapor deposition apparatus is used as $\omega$. For example, when silane gas is used as the raw-material gas, hydrogen gas is used as the carrier gas and the rotational number of the rotational substrate holder is set to 500 to 2000 rpm (52 to 209 rad/s), the transition layer thickness T is equal to about 5 to 50 mm. Accordingly, it is preferable that the rotational substrate holder is located so that the upper surface thereof is located at a position lower than the lower end B of the small-diameter upper portion 1 of the reactor by a height difference H which is larger than the T value, whereby the gas stream from the center to the outer periphery above the wafer substrate is further smoothed, and there occurs no adhesion of particles of thin-film forming raw material, so that a uniform thin-film formed wafer having no crystal defect can be formed.

In the reactor having the upper and lower portions which are different in diameter s described above, it is preferable that the small diameter $D_1$ of the upper portion 1 of the reactor, the large diameter $D_2$ of the lower portion 2 and the diameter $D_S$ of the rotational substrate holder 12 have the following relationship. For example, $D_1$ is larger than the diameter of the wafer, and (1) $D_2/D_1$ is equal to 1.2 or more ($D_2/D_1 \geq 1.2$). If $D_1$ is smaller than the diameter of the wafer, the particles which fall down from the inner wall surface of the upper portion 1 of the reactor are liable to adhere to the wafer substrate mounted on the rotational substrate holder 712, so that there is such a trend that crystal defects measured as LPD (wafer surface laser scatterer) increase. Further, it is difficult to perform a contactless temperature measurement based on infrared ray on the outer peripheral portion of the wafer substrate which is usually performed in the vapor deposition process. On the other hand, if $D_2/D_1$ is less than 1.2, the blow-up phenomenon of the ascending gas flow along the wall of the reactor occurs, and thus the gas eddy flow occurs. Accordingly, (2) The $D_1/D_S$ ratio is equal to 0.7 to 1.2 ($0.7 \leq D_1/D_S \leq 1.2$). If $D_1/D_S$ is smaller than 0.7, the side surface of the upper portion 1 is excessively proximate to the wafer substrate mounted on the rotational substrate holder 712, and the particles which fall down from the inner wall surface of the reactor are liable to adhere to the wafer substrate. Therefore, as in the case where $D_1$ is smaller than the diameter of the wafer substrate, the crystal defects measured as LPD are increased, and the quality of the thin-film formed wafer substrate is reduced. On the other hand, if $D_1/D_S$ is larger than 1.2, as in the case where the ratio $D_2/D_1$ is less than 1.2, the blow-up phenomenon of the gas flow along the inner wall of the reactor occurs, and the gas eddy flow occurs.

(3) $D_2/D_S$ is equal to 1.2 or more ($D_2/D_S \geq 1.2$). If $D_2/D_S$ is smaller than 1.2, the gas flow disturbance at the outside of the rotational substrate holder 712 cannot be suppressed. Therefore, the particles adhere to the inner wall of the reactor which corresponds to the outside of the rotational substrate holder 712, and the non-reacted gas is reacted at the lower side of the rotational substrate holder 712, so that the thin-film forming composites deposit on the inner wall of the lower portion 2 of the reactor.

The reactor of the vapor deposition apparatus of the second aspect of the present invention can be designed and manufactured in substantially the same construction as the hollow cylindrical reactor having the same diameter of the conventional vapor deposition apparatus, except that the reactor is a hollow cylindrical reactor sectioned into cylindrical upper and lower portions which are difference in diameter, but continuous with each other, the straightening gas hole is provided to the link portion between the upper and lower portions and each member is disposed at a predetermined position as described above. Further, the vapor deposition method using the vapor deposition apparatus of this aspect of the present invention can be performed in the same manner as described above.

In the vapor deposition apparatus of the present invention thus constructed, the inside of the reactor 710 is evacuated by the exhausting control device which is connected to the exhaust ports 715, and the inner pressure of the reactor is adjusted to 20 to 50 torr by the reaction gas containing the raw-material gas and the carrier gas. Further, the rotational substrate holder 712 is rotated through the rotational shaft 713 by actuating the motor, and the wafer substrate 711 is also simultaneously rotated. At the same time, the wafer substrate 711 on the rotational substrate holder 712 is heated to about 900 to 1200 degrees Celsius by the heater 714. Further, at the same time, the reaction gas containing the raw-material gas and the carrier gas is supplied from the plural reaction gas supply ports 716 into the reactor 710 while controlling the flow amount of the reaction gas to a predetermined value. The gas flow which is supplied from the plural reaction gas supply ports 716 into the space area S is uniformed in momentum and pressure distribution, and then passed through the holes 717*a* of the straightening vane 717 to make uniform the gas flow distribution in the reactor and then supplied onto the wafers substrate to uniformly form a thin film on the substrate by vapor deposition. In the vapor deposition apparatus of this aspect of the present invention, simultaneously with the supply of the reaction gas, the same gas as the carrier gas is usually introduced as the straightening gas from the straightening gas flow-out ports 718*a* of the link portion 718.

In this case, it is preferable that the ratio ($G_1/G_C$) of the flow rate ($G_C$) of the reaction gas supplied from the reaction gas supply ports 716 and the flow rate ($G_1$) of the straightening gas introduced from the straightening gas flow-out holes of the link portion 718 is equal to 0.05 to 2 ($0.05 \leq G_1/G_C \leq 2$). If $G_1/G_C$ is less than 0.05, the gas flow disturbance occurs at the large-diameter portion of the lower portion of the reactor which is located at the outside of the rotational substrate holder 712, and thus this condition is inconvenient. Further, if $G_1/G_C$, is over 2, the gas flow rate at the large-diameter portion at the outside of the rotational substrate holder 712 is excessively high, and the smooth gas flow directing from the center of the rotational substrate holder 712 to the outer periphery thereof above the rotational substrate holder 712 is disturbed, so that any homogeneous thin film having a uniform thickness cannot be grown. Therefore, this condition is inconvenient. Accordingly, by flowing the straightening gas from the straightening gas flow-out holes 718*a* of the link portion 718 so that the ratio $G_1/G_C$. is within the above range, the flow of the reaction gas on the rotational substrate holder and the flow of the non-reacted gas from the outer peripheral side of the rotational substrate holder to the hollow space at the lower portion of the reactor can be smoothened with no occurrence of gas eddy flow and no occurrence of gas flow disturbance, so that a high-quality homogeneous thin-film formed wafer substrate having little crystal defect can be obtained.

Figure 8:
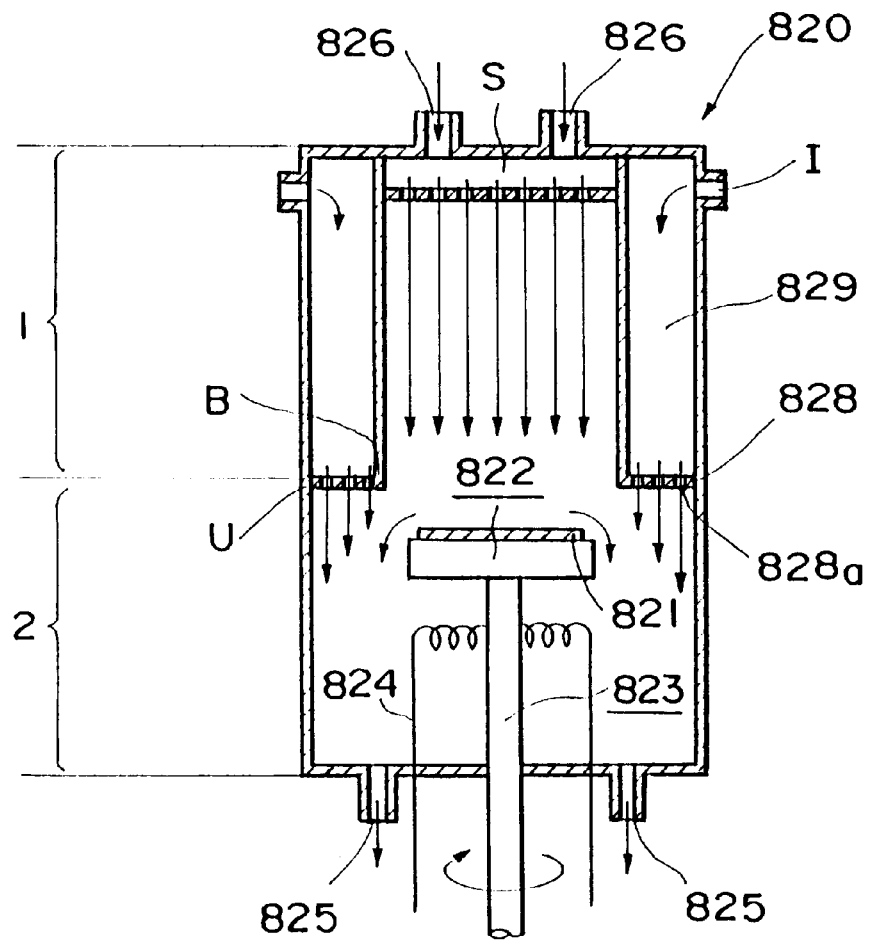
FIG. 8 is a sectional view showing another embodiment of the apparatus of the second aspect of the present invention.

The straightening gas holes provided to the link portion are arranged so as to prevent occurrence of gas eddy flow due to the blow-up of the ascending gas and occurrence of gas flow disturbance at the large-diameter portion of the reactor. The arrangement of the straightening gas holes is not limited to a specific one, and it may be suitably selected in accordance with the reaction conditions such as the capacity of the reactor, the type of the reaction gas, the flow rate of the reaction gas, the rotational speed of the rotational substrate holder, etc. Usually, the flow-out holes having the same diameter are arranged uniformly (at equal intervals) over the whole area of the link portion 718 so that the gas flow rate is uniformly distributed like the stream of the straightening gas as indicated by arrows of FIG. 7. In order to provide a gradient to the flow-out rate distribution of the straightening gas, the straightening gas flow-out holes may be arranged so that the opening diameter of the straightening gas flow-out holes may be varied so as to have a predetermined opening diameter distribution. For example, in a diagram showing another embodiment of the vapor deposition apparatus of FIG. 8, the straightening gas is made flow from the link portion to have such a gradient flow rate distribution that the flow rate of the straightening gas is higher at the at the inner peripheral wall side of the lower portion 2 of the reactor and lower at the center side as indicated by arrows which show the stream of the straightening gas from the straightening gas flow-out holes 828*a* of the link portion 828. In FIG. 8, the same members as those of the apparatus of FIG. 7 are represented by setting the first digit to the same value or by the same reference numerals.

Figure 9:
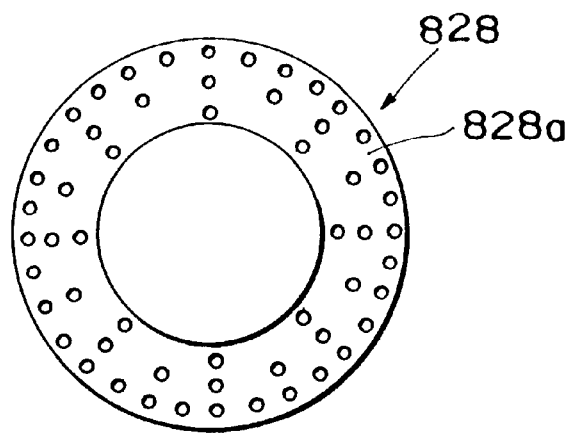
FIG. 9 is a plan view showing a link portion of the apparatus of FIG. 8.

In order to the provide the straightening gas flow with such a gradient that the flow rate is gradually increased in the direction from the inner peripheral wall side to the center side, the straightening gas flow-out holes 828*a* are arranged as shown in a plan view of the link portion 828 of FIG. 9. That is, a larger number of flow-out holes are arranged at the inner peripheral wall side while a smaller number of flow-out holes are arranged at the center side. Such an arrangement of the straightening gas flow-out holes that the straightening gas has a predetermined flow-rate gradient is effective to prevent the occurrence of gas eddy flow and gas flow disturbance, and straighten (rectify) the flow of the reaction gas, so that the non-reacted gas can be smoothly exhausted from the lower portion of the reactor.

Figure 10:
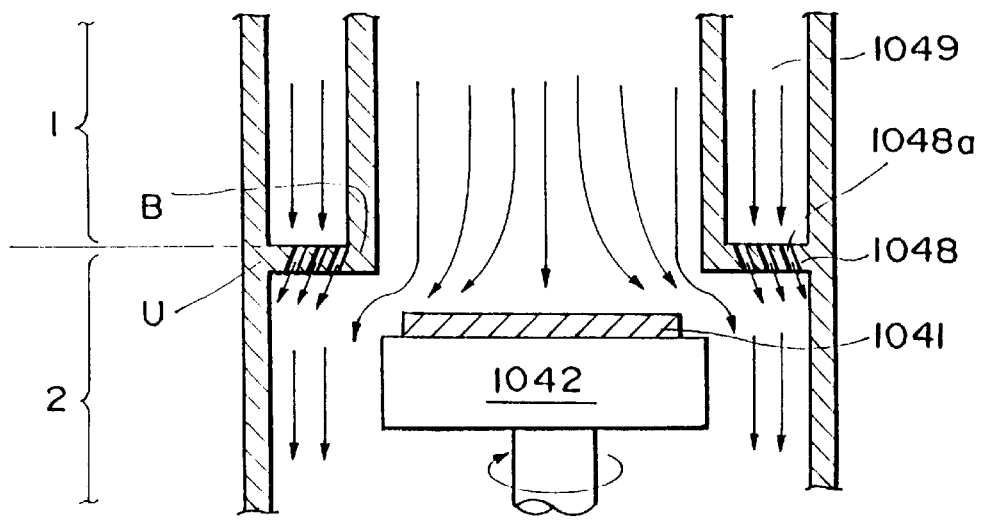
FIG. 10 is a sectional view showing a link portion area of another embodiment of the apparatus of the second aspect of the present invention.

In the apparatus of this aspect of the present invention, no restriction is imposed on the flow-out direction of the straightening gas. Usually, the straightening gas is made to flow out in the vertical direction to the surface of the rotational substrate holder as shown in FIGS. 7 and 8. However, if necessary, it may be made to flow out in a direction other than the vertical direction. That is, by forming the straightening gas flow-out holes in the link portion so that the direction of the flow-out holes is not in parallel to the rotational shaft of the rotational substrate holder (i.e., in the vertical direction), but slant at an angle, the straightening gas may be made to flow out from the straightening gas flow-out holes at a slant angle to the rotational shaft of the rotational substrate holder. For example, FIG. 10 is a partially enlarged sectional view showing an example of the link portion area. In FIG. 10, straightening gas flow-out holes 1048*a* of a link portion 1048 are formed in a slant direction at a predetermined angle toward the inner peripheral wall of the reactor. The straightening gas from the straightening gas flow-out holes 1048*a* flows out so as to be away from the rotational shaft in the inner peripheral wall direction. The structure of the straightening gas flow-out holes as described above is preferable to prevent occurrence of the gas flow disturbance in the vicinity of the rotator. In this case, the slant angle is usually set to about 10 to 80 degrees to the rotational shaft of the rotational substrate holder so that the straightening gas flow-out holes are slanted toward the inner peripheral wall of the reactor. When the holes are slanted to the direction of the rotational shaft, the straightening gas promotes disturbance of the gas flow which is swept out from the rotator, and thus this is unfavorable.

Figure 11:
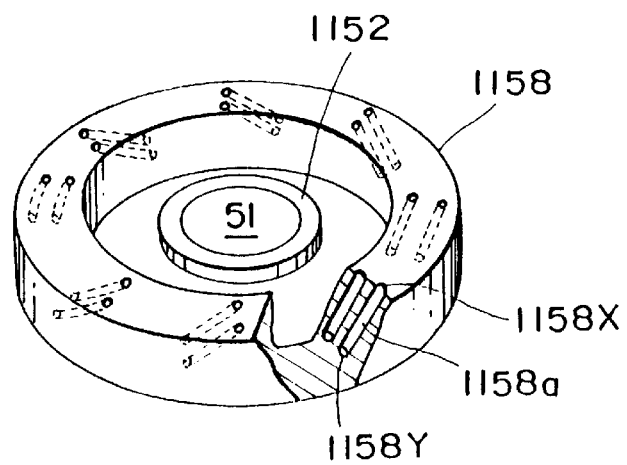
FIG. 11 is a perspective view showing a notch portion of the link portion of another embodiment of the apparatus of the second aspect of the present invention.

Further, the straightening gas may be made to flow out in coincidence with the rotational direction of the rotational substrate holder. For example, FIG. 11 is a partially notched perspective view showing an annular link portion 1158 in which straightening gas flow-out holes 1158*a* are formed obliquely at a predetermined angle in the peripheral direction. In FIG. 11, each straightening gas flow-out hole 1158*a* is formed so as to extend obliquely in the peripheral direction from the opening 1158x thereof on the gas flow-in face to the opening 1158y thereof on the gas flow-out face corresponding to the back surface of the annular link portion. The straightening gas from the straightening gas flow-out holes 1158a flows out in the same peripheral direction as the rotation of the rotational substrate holder. The structure of the straightening gas flow-out holes as described above is favorable to prevent the gas flow disturbance in the vicinity of the rotator. In this case, the slant angle is set to about 10 to 80 degrees in the peripheral direction to the gas flow-in face of the link portion. Further, each straightening gas flow-out hole may be slanted not only in the peripheral direction, but also in the radial direction toward the center to flow out the straightening gas in the rotational direction of the rotational substrate holder.

Figure 12:
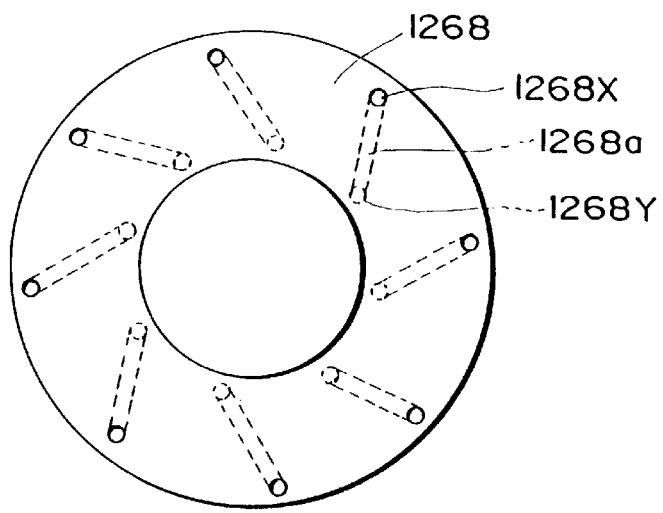
FIG. 12 is a plan view showing a link portion of another embodiment of the apparatus of the second aspect of the present invention.

FIG. 12 is a plan view showing an example of a link portion in which straightening gas flow-out holes 1268a of an annular link portion 1268 is formed at a slant angle in the peripheral direction and in the radial direction to the center side. In FIG. 12, the straightening gas flow out hole is formed so as to extend from the opening 1268 thereof on the gas flow-in face 1268 obliquely in the peripheral direction and in the radial direction to the center of the annular link portion and finally intercommunicate with the opening 1268Y on the gas flow-out face which corresponds to the back surface. The straightening gas from the straightening gas flow-out hole 1268a flows out as if it rotates in the same rotational direction as the rotational substrate holder. The structure of the straightening gas flow-out holes as described above is favorable because it does not disturb the gas flow in the vicinity of the rotator. In this case, the slant angle is usually set to about 10 to 80 degrees to the gas flow-in face of the link portion, and also to about 10 to 80 degrees in the peripheral direction.

In the vapor deposition apparatus of the first aspect of the present invention, the gas flow rate of the reaction gas flow introduced into the reactor is varied between the center portion and the outer peripheral portion of the reactor, and particularly the gas flow rate at the outer peripheral portion is set to be higher than that at the center portion. Further, in the vapor deposition apparatus of the second aspect of the present invention, the reactor is divided into the small-diameter upper portion and the large-diameter lower portion, and the lower end of the upper portion and the upper end of the lower portion are linked to each other to make continuous the hollow inner spaces of the upper and lower portions. Further, gas flow-out holes are provided to the link portion between the upper and lower portions, and the straightening gas is introduced together with the reaction gas. In both the vapor deposition apparatuses, the upward blow-up phenomenon of the reaction gas in the reactor can be prevented, and thus the increase of the temperature of the reaction gas can be also suppressed. Therefore, the uniform nucleus formation of the raw-material gas can be suppressed, and the particles occurring in vapor phase can be reduced.

According, the particles which adhere to the inner wall of the reactor to shorten the maintenance cycle or directly adhere to the wafer to induce crystal defects can be reduced, so that a high-quality wafer substrate can be manufactured.

Particularly in the vapor deposition apparatus of the first aspect of the present invention, the gas flow in the reactor is kept stabilized and made to smoothly flow through the reactor without producing any particle, any eddy flow and any drift, so that the reaction gas can flow smoothly and with no trap along the wafer substrate on which the thin film is formed. Therefore, no re-doping of dopant occurs and the in-plane resistance of the wafer substrate thus obtained is further uniformed. Further, in the vapor deposition apparatus of the second aspect of the present invention, the gas flow-out holes are provided to the link portion between the upper and lower portions, and the straightening gas is made to flow simultaneously wit the reaction gas, so that the gas flow to the exhaust ports at the lower portion of the reactor is stabilized to be straightened (rectified). Therefore, occurrence of gas eddy flow above the rotational substrate holder can be prevented, the disturbance of the reaction gas flow at the outer peripheral side can be prevented, and the deposition of deposits at the lower portion of the reactor can be prevented by the link portion, so that the maintenance cycle of the reactor can be kept long.

EXAMPLES

Examples 1 to 3

A thin film was formed on a wafer substrate by using a vapor deposition apparatus using a reactor having a circular section which was designed in the same construction as the hollow reactor shown in FIG. 1A. The boundary between the X area and the Z area was set so that the ratio (X/Y) between the interval width X of the outer area (X area) having a larger opening degree from the inner wall of the reactor and the difference Y between the radius ($R_D$) of the straightening vane 17 and the radius of the rotational substrate holder 12, that is, the radius ($R_P$) of the orthogonal projection shape of the rotational substrate holder 12 onto the straightening vane 17 was set to the ratio (X/Y) shown in table 1. Gas holes were formed in the straightening vane so that gas holes 17a having a diameter and an opening degree (%) shown in the table 1 were formed in the Z area while gas holes 17b having a diameter and an opening degree (%) shown in the table 1 were formed in the Z area, and the straightening vane thus constructed was disposed in the reactor. $SiH_4$ gas was used as raw-material gas and $H_2$ gas was used as carrier gas. Further, $H_2$ gas containing 0.1 ppm of diborane ($B_2H_6$) was used as dopant. The flow amount (rate) of the reaction gas was adjusted so that the flow rate (Vz) of the reaction gas in the X area and the flow rate (Vz) in the Z area satisfied the ratio (Vx/Vz) shown in the table 1. Further, the reaction temperature, the reaction pressure and the rotational number of the rotational substrate holder were set as shown in the table 1.

Under the vapor deposition condition shown in the table 1, a $B_2H_6$-doped silicon thin film was formed on a silicon wafer by vapor deposition. After the vapor deposition of the thin film, adhesion of particles onto the inner wall of the reactor of the vapor deposition apparatus was visually observed, and the adherence condition (large or small) is shown in the table 1. Further, with respect to the characteristics of the crystal phase on the surface of the thin-film formed wafers substrate, the number of LPDs above 0.135 μm or more was measured by using Surfscan 6200 produced by Tencol company, and the measurement result is shown as "number per wafer" in FIG. 1A. Further, the film thickness of the thin film thus formed was measured by an infrared interferometer to measure the maximum thickness (Fmax) and the minimum thickness (Fmin) and then estimate the uniformity of the thin film thickness from (Fmax−Fmin)/(Fmax+Fmin)×100. The estimation result is shown in the table 1. Further, the resistance value of the thin-film formed wafer substrate thus obtained was measured by the CV method to calculate the maximum value (Rmax) and the minimum value (Rmin) and estimate the uniformity of the resistance value due to the doping of the dopant from (Rmax−Rmin)/(Rmax+Rmin)×100. The estimation result is shown in the table 1.

Example 4

A thin film was formed on a wafer substrate by using the vapor deposition apparatus having the circular section which was designed in the same construction as the hollow reactor shown in FIG. 4. The straightening vane 17 having an opening degree shown in the table 2 in the overall area thereof was used. Further, a partition plate 18 having the same diameter as the rotational substrate holder was disposed at the circular outer edge portion in the space area above the straightening vane to divide the space area at the upper portion into an Sx area and an Sz area. The reaction gas similar to that of the embodiment 1 was supplied into the Sz area under the condition shown in the table 2, and $H_2$ gas was supplied into the Sx area at the flow amount (rate) show in the table 2 to form a $B_2H_6$-doped silicon thin film on a silicon wafer by vapor deposition. The observation result of the inside of the reactor and the measurement result of the thin-film formed wafer substrate which was obtained by the same measurement as the embodiment 1 are shown in the table 2.

Examples 5 and 6

A thin film was formed on a wafer substrate by using the vapor deposition apparatus having the circular section which was designed in the same construction as the hollow reactor shown in FIGS. 5 (embodiment 5) and FIG. 6 (embodiment 6). The apparatus was designed under the condition shown in the table 2. In the embodiment 6, the reaction gas and the straightening gas were adjusted and supplied so that the $H_2$ gas was supplied from the link portion 20 into the Y area at the flow rate shown in the table 2, and the ratio between the flow rate (Vx) of the reaction gas in the X area and the flow rate (Vy) of th reaction gas in the Y area was equal to the ratio (Vx/Vy) shown in the table 2 to form a $B_2H_6$-doped silicon thin film on a silicon wafer by vapor deposition. The observation result in the reactor and the same measurement result on the thin-film formed wafers substrate as the embodiment 1 are shown in the table 2.

Comparison Examples 1 and 2

A $B_2H_6$-doped silicon thin film was formed on a silicon wafer in the same manner as the embodiment 1 by using the vapor deposition apparatus which was designed in the same construction as the reactor of the embodiment 1, except that the straightening vane was formed under the condition shown in the table 2 and disposed in the reactor for a comparison example 1 in which the ratio Vx/Vz was set to be less than a predetermined value and a comparison example 2 in which the ratio Vx/Vz is set to more than a predetermined value. The observation result in the reactor and the measurement result on the thin-film formed wafer substrate are shown in the table 3.

Comparison Examples 3 and 4

Figure 14:
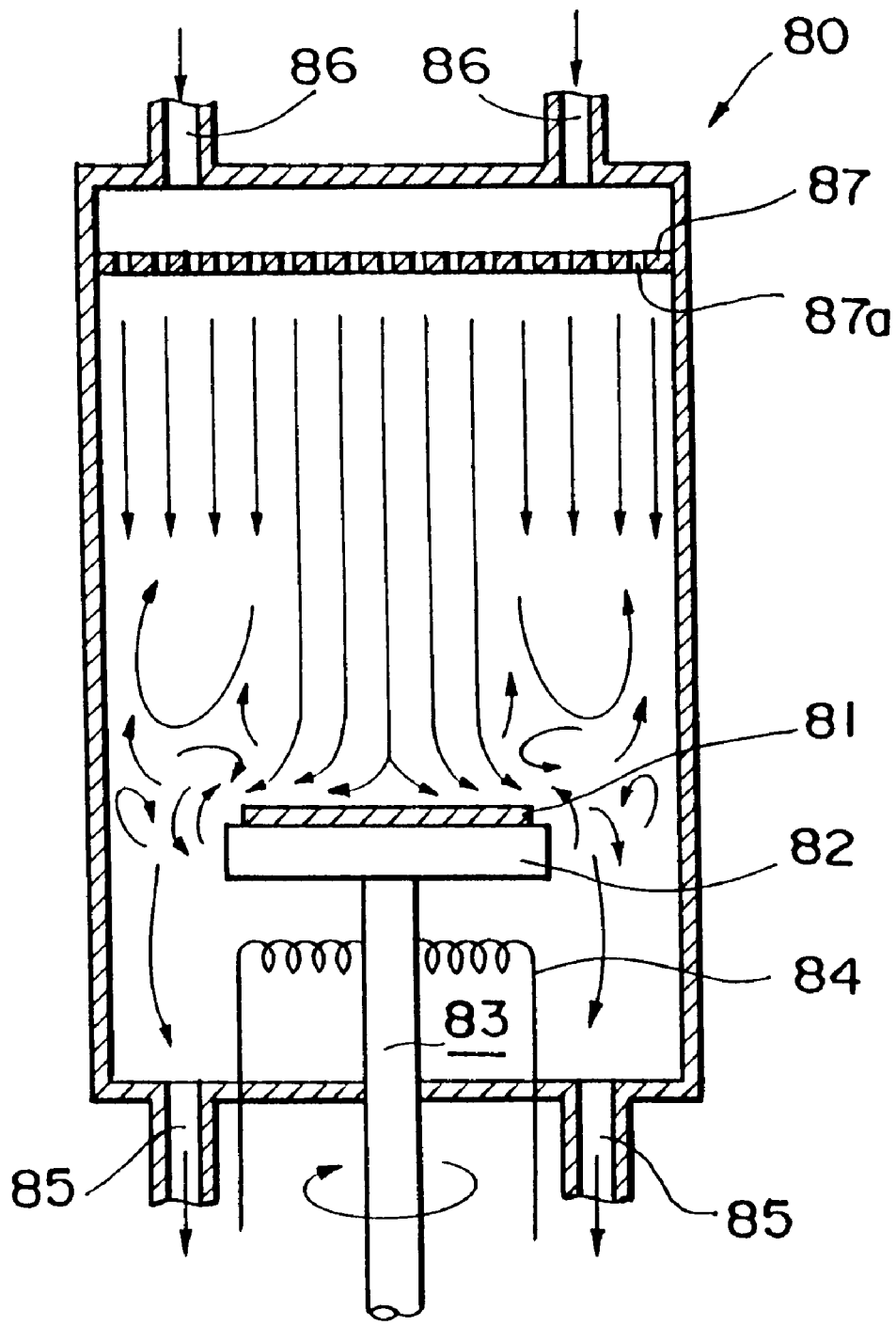
FIG. 14 is a sectional view showing a conventional thin film vapor deposition apparatus.

By using the vapor deposition apparatus using the same reactor as the conventional vapor deposition apparatus shown in FIG. 14 in which the gas holes having a uniform opening degree were uniformly formed, a $B_2H_6$-doped silicon thin film was formed on the surface of a silicon wafer in the same manner as the embodiment 1 under the vapor deposition reaction condition shown in the table 2. The observation result of the inside of the reactor and the measurement result on the thin-film formed wafer substrate obtained in the same manner are shown in the table 3.

As is apparent from the examples and the comparison examples, when the flow rate of the reaction gas in the X area having a predetermined width around the inner periphery of the reactor is set to be higher than that in the Z area at the center side by a predetermined rate, the number of LPDs of the crystal phase on the surface of the thin-film formed wafer substrate is equal to 1000 or less, so that an excellent thin-film formed wafer substrate can be obtained. The number of LPDs is reduced to about ⅕₀ or less as compared with the comparison example 1 in which the flow rate ration is lower than the predetermined ratio and the comparison example in which the carrier gas was made to flow in the same manner as the embodiment in the conventional system. Further, the number of LPDs is reduced to about ¹⁄₁₃₀ or less as compared with the comparison example 2 in which the reaction gas was made to flow at a high flow rate in an area broader than the predetermined width. Still further, the number of LPDs in the comparison example 4 in which the carrier gas was made to flow at 200 liter/minute by the conventional system was measured 1000 or more. Therefore, it is apparent that the vapor deposition apparatus and method of the present invention provide more excellent thin films. With respect to the uniformity of the thin film thickness, the uniformity in the present invention was lower than the comparison example 4, however, the uniformity of the resistance value was higher than the comparison example 4. Accordingly, the present invention can provide a higher quality thin-film formed wafer substrate without using a large amount of carrier gas.

Examples 7 to 11

The vapor deposition apparatus used for these examples was designed in a hollow cylinder structure like the reactor shown in FIG. 7, the inner $D_1$ of the upper portion of the reactor, the inner diameter $D_2$ of the lower portion of the reactor and the diameter $D_S$ of the rotational substrate holder were set as shown in table 4, and the lower end B of the upper portion and the upper surface of the rotational substrate holder were located to keep a height difference H shown in the table 4 therebetween. $SiH_4$ gas was used as raw-material gas, $H_2$ gas was used as carrier gas, and $H_2$ gas containing 0.1 ppm diborane ($B_2H_6$) was used as dopant. These gas were supplied at a flow rate shown in the table 4, and the same type $H_2$ gas as the carrier gas was vertically and uniformly supplied at a flow rate shown in the table 4 as straightening gas. The ratio ($G_1/G_C$) between the flow rate of the reaction gas (m/s) and the flow rate of the straightening gas (m/s), the reaction temperature, the reaction pressure and the rotational number of the rotational substrate holder are shown in the table 4.

A $B_2H_6$-doped silicon thin film was formed on a silicon wafer under the vapor deposition condition shown in the table 4. After the vapor deposition, the adhesion of particles to the link portion and the inner peripheral wall of the lower portion of the reactor in the used vapor deposition apparatus was visually observed to check the adhesion condition (large amount or small amount) of the particles, and the result is shown in the table 4. With respect to the characteristics of the crystal phase on the surface of the thin-film formed wafer substrate thus obtained, the number of LPDs (wafer surface laser scatterers) of 0.135 μm or more was measured by using Surfscan 6200 produced of Tencol company. The result is shown as "number per wafer" in the table 4. Further, the film thickness of the thin film thus formed was measured by using an infrared interferometer, an d the maximum thickness (Fmax) and the minimum thickness (Fmin) were determined to estimate the uniformity of the thin film thickness from (Fmax−Fmin)/(Fmax+Fmin)×100. The estimation result is shown in the table 4. Further, the resistance value of the thin-film formed wafer substrate thus obtained was measured by the C-V method, and the maximum value (Rmax) and the minimum value (Rmin) were calculated to estimate the uniformity of the resistance value due to the doping of the dopant from (Rmax−Rmin)/(Rmax+Rmin)× 100. The result is shown in the table 4.

Comparison Examples 5 and 6

The vapor deposition apparatus used for these comparison examples 5 and 6 was designed in the same construction as the reactor of the embodiment 7 except that the straightening gas was made to flow from the link portion at an extremely low flow rate (comparison example 5) or at a high flow rate (comparison example 6), and a $B_2H_6$-doped silicon thin film was formed on a silicon wafer in the same manner as the embodiment 7. The observation result in the apparatus and the measurement result on the thin-film formed wafer substrate are shown in the table 5.

Comparison Examples 7 to 17

Figure 13:
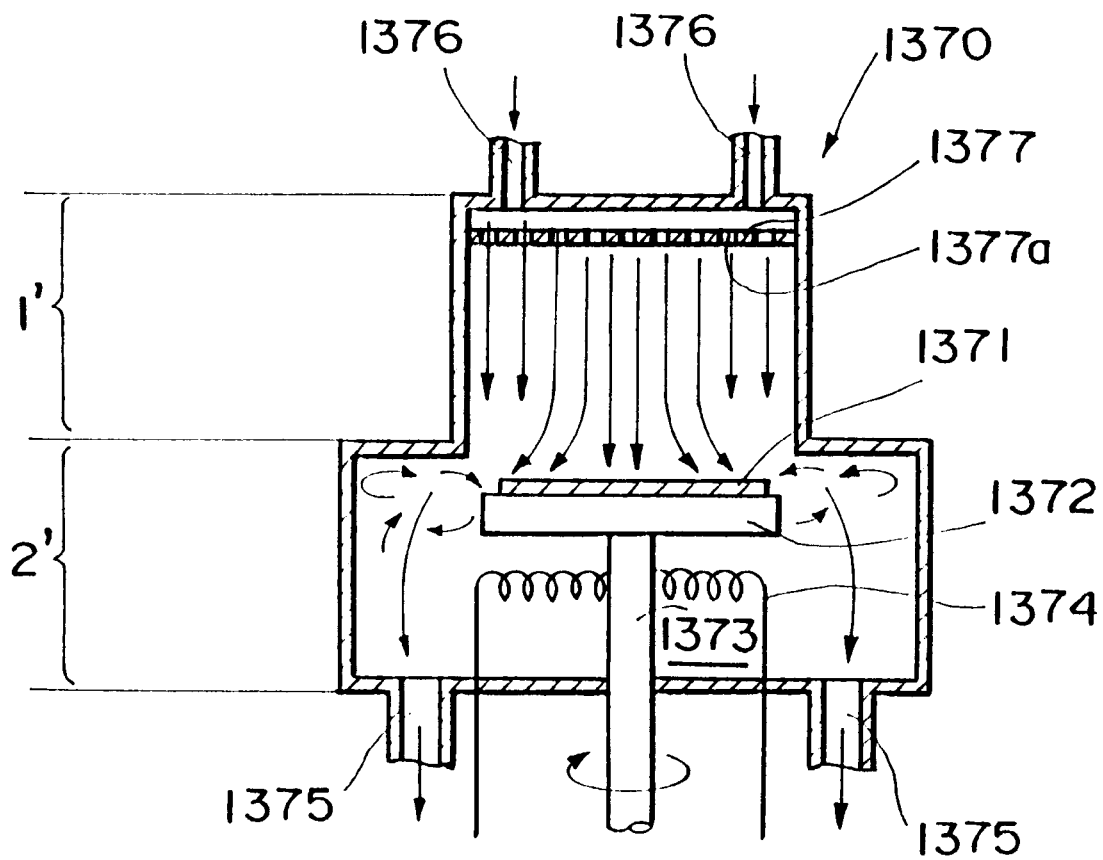
FIG. 13 is a sectional view showing a thin film vapor deposition apparatus which is used as a comparison example.

A silicon thin film was formed on a wafer substrate in the same manner as the embodiment 7 by using a reactor 1370 of the vapor deposition apparatus shown in FIG. 13. In FIG. 13, the vapor deposition apparatus used for these comparison examples was designed in the same construction as the vapor deposition apparatus having the reactor of the embodiment 7, except that the reactor 1370 had a small-diameter upper portion 1' and a large-diameter lower portion 2' which were different in inner diameter, and no straightening gas flow-out port was provided to the link portion between the upper and lower portion. In FIG. 13, the same members as the apparatus of FIG. 7 are represented by setting the same numerals at the lower digits or by the same numerals. In the reactor 1370, the ratio of the inner diameter $D_1$ of the upper portion of the reactor, the inner diameter $D_2$ of the lower portion of the reactor and the diameter $D_S$ of the rotational substrate holder was varied as shown in the tables 5 and 6, and a $B_2H_6$-doped silicon thin film was formed on a silicon wafer in the same manner as the embodiment 7. The observation of the inside of the apparatus and the measurement result on the thin-film formed wafer substrate obtained by the same measurement as the embodiment are shown in the tables 5, 6 and 7.

Comparison Examples 18 and 19

A $B_2H_6$-doped silicon thin film was formed on the surface of a silicon wafer under the same vapor deposition reaction condition as shown in the table 7 by using a reactor which was designed in the same construction as a reactor 80 of a conventional vapor deposition apparatus shown in FIG. 14 in which the reactor was not divided into upper and lower portions (i.e., the upper and lower portions had the same diameter), and thus no link portion was provided. The observation result of the inside of the apparatus and the measurement result on the thin-film formed wafer substrate are shown in the table 7.

As is apparent from the embodiments and the comparison examples, when the reactor was divided into upper and lower portions which were different in diameter and the straightening gas was made to flow from the link portion at which the diameter of the reactor was increased, the number of LPDs of the crystal phase of the surface of th thin-film formed wafer substrate thus obtained was equal to 100 or less, that is, the number of LPDs was reduced to about 1/300 or less as compared with the comparison example 18 which used the conventional vapor deposition apparatus under the same reaction condition. Further, it is apparent that the uniformity of the thin film thickness was equal to 1 or less and thus an extremely uniform thin film was formed. Further, the uniformity of the resistance value was equal to 4.4 or less. That is, there occurred no crystal defect, and the re-doping of the dopant was prevented, so that a homogeneous thin film was formed. Further, when the carrier gas was made to flow at a high flow rate in the conventional apparatus as in the case of the comparison example 19, the film thickness was relatively uniform, the number of LPDs was small and the crystal phase was relatively excellent. However, it was estimated that the uniformity of the resistance value was low and gas flow disturbance occurred at the outer peripheral side of the rotational substrate holder. Further, a large amount of deposits were observed at the lower portion of the reactor, and it could be estimated that the maintenance cycle was shortened.

On the other hand, as in the case of the comparison examples 7 to 17, even in the case where the reactor having the upper and lower portions which were different in diameter was used, if no straightening gas was made to flow from the link portion, the uniformity of the film thickness, the uniformity of the resistance value, the number of LPDs, and the amount of deposits at the lower portion of the reactor were estimated and measured to be more excellent in the comparison example 7 having the same diameter ratio of the upper and lower portions as the embodiments than in the conventional case where the carrier was made to flow at an usual flow rate (comparison example 18), however, the these characteristics were more deteriorated as compared with the embodiments in which the straightening gas was made to flow. Further, it is apparent that even when the ratio between the diameter of the lower portion of the reactor and the diameter of the rotational substrate holder was variously varied, the comparison examples cannot provided more excellent results as compared with the embodiments. The comparison examples 12 and 13 in which the diameter of the lower portion was set to about 3 to 4 times of the diameter of the upper portion provided relatively excellent thin films. However, the dimension of the apparatus is excessively large in size. Further, in these cases, deposits were observed at the link portion, and the crystal defects were somewhat increased, resulting in increase of the maintenance cycle of the reactor. Still further, in the comparison example 12 in which the lower end B of the upper portion of the reactor and the upper surface of the rotational substrate holder were proximate to each other at a height interval of 5 mm, the number of LPDs was remarkably increased, and the defect of the crystal phase, the uniformity of the thin film thickness and the uniformity of the resistance value are remarkably deteriorated.

Further, according to the comparison examples 5 and 6, when the reactor of the vapor deposition apparatus of the present invention was used and the flow rate of the straightening gas from the link portion was set to be lower than the flow rate of the reaction gas, the thin film obtained was relatively excellent. However, when the flow rate of the straightening gas was set to three times of the flow rate of the reaction gas, the number of LPDs was remarkably reduced, and the deposition amount at the lower portion of the reactor was increased although no deposits was observed at the link portion. Therefore, the characteristics ojf the thin film thus obtained were deteriorated.

The transition layer thickness T in the embodiments (examples) and the comparison examples was calculated as 18 to 21 mm by substituting $\omega$=209 rad/s, $\nu$=6608 to 8811 $mm^2$/s into the equation (1).

What is claimed is:

1. A vapor deposition apparatus comprising:
  a hollow reactor having a gas supply port at a top portion thereof and an exhaust port at a bottom portion thereof, said gas supply port being adapted to supply reaction gas into said reactor to form a thin film on a surface of a wafer substrate;
  a rotational substrate holder positioned inside said reactor, said substrate holder being adapted to seat a wafer substrate; and
  a straightening vane having a central portion and an outer portion extending radially outwardly from said central portion,
  wherein said central portion is defined by an area at least as large as an area of said substrate holder and concentric with said substrate holder, and
  wherein said central portion has first gas holes and said outer portion has second gas holes, the total area of the openings of said second gas holes being larger than that of the first gas holes.

2. The vapor deposition apparatus as claimed in claim 1 wherein said straightening vane and said substrate holder each are circular and said reactor has a cylindrical wall, said straightening vane extending to an inner peripheral surface of said reactor cylindrical wall, and wherein said outer portion has a radial distance (X), which is equal to less than a difference (Y) between the radius ($R_D$) of the reactor cylindrical wall and the radius ($R_S$) of the substrate holder or an equivalent projected radius ($R_P$) thereof.

3. The vapor deposition apparatus as claimed in claim 2, wherein a ratio (X/Y) between said radial distance (X) of said outer portion and said difference (Y=$R_D$-$R_P$ (or $R_S$)) is set to 0.02 to 1.0.

4. The vapor deposition apparatus as claimed in claim 1, wherein said reactor is designed to be circular in horizontal section, and said straightening vane and said rotational substrate holder are coaxially disposed in said reactor.

5. The vapor deposition apparatus as claimed in claim 1, wherein a space area is defined between the top portion of said reactor and said rotational substrate holder, the space area being divided into at least two sections by a partition member disposed radially outwardly from said rotational substrate holder, and at least two reaction gas supply ports being provided to each of the sections.

6. The vapor deposition apparatus as claimed in claim 5, wherein said straightening vane and said substrate holder each are circular and said reactor has a cylindrical wall, said straightening vane extending to an inner peripheral surface of said reactor cylindrical wall, wherein said outer portion has a radial distance (X), which is equal to less than a difference (Y) between the radius ($R_D$) of the reactor cylindrical wall and the radius ($R_S$) of the substrate holder or an equivalent projected radius ($R_P$) thereof, and wherein a ratio (X/Y) between said radial distance (X) of said outer portion and said difference (Y=$R_D$-$R_P$ (or $R_S$)) is set to 0.02 to 1.0.

7. The vapor deposition apparatus as claimed in claim 5, wherein said reactor is designed to be circular in horizontal section, and said straightening vane and said rotational substrate holder are coaxially disposed in said reactor.

8. The vapor deposition apparatus as claimed in claim 6, wherein an individual reaction gas supply system is connected through said reaction gas supply ports to each of said sections.

9. The vapor deposition apparatus as claimed in claim 1, wherein said reactor is divided into upper and lower portions having different inner diameters, the inner diameter of said upper portion is smaller than the inner diameter of said lower portion, and the lower end of said upper portion and the upper end of said lower portion are connected to each other, forming continuous hollow upper and lower portions.

10. A vapor deposition apparatus comprising:
  a hollow reactor having a gas supply port in the upper portion thereof and an exhaust port in the lower portion thereof, said gas supply port being adapted to supply reaction gas into said reactor to form a thin film on a surface of a wafer substrate, said reactor being sectioned into upper and lower portions having different inner diameters, the inner diameter of said upper portion being smaller than the inner diameter of said lower portion;
  a link portion connecting the lower end of said upper portion to the upper end of the lower portion, said link portion having straightening gas flow-out holes;
  a rotational substrate holder, which is adapted to seat a wafer substrate, positioned inside said reactor below the lower end of said upper portion; and
  a straightening vane having a plurality of gas holes situated in the upper portion of the reactor,
  wherein said straightening gas flow-out holes are directed either vertically downwardly or downwardly and outwardly toward the lower portion to direct straightening gas away from the substrate holder.

11. The vapor deposition apparatus as claimed in claim 10, wherein a space portion is provided above said link portion so as to hermetically envelop said straightening gas flow-out holes, and straightening gas supply ports are provided in said space portion.

12. The vapor deposition apparatus as claimed in claim 11, wherein said space portion and said upper portion are constructed in a dual-wall structure, and an outside surface of the space portion extends from the upper end of the lower portion through said link portion.

13. The vapor deposition apparatus as claimed in claim 11, wherein the side surface of said upper portion is vertical to the upper surface of said rotational substrate holder.

14. The vapor deposition apparatus as claimed in claim 10, wherein the hollow inside of said reactor is designed to be circular in horizontal section, the diameter of said upper portion ($D_1$) is larger than the diameter of said wafer substrate, said rotational substrate holder is designed in a circular shape, and the ratio ($D_1/D_S$) between the diameter of said upper portion ($D_1$) and the diameter of said rotational substrate holder ($D_S$) is set to 0.7 to 1.2.

15. The vapor deposition apparatus as claimed in claim 14, wherein the ratio ($D_2/D_1$) between the diameter of said upper portion ($D_1$) and the diameter of said lower portion ($D_2$) is set to 1.2 or more.

16. The vapor deposition apparatus as claimed in claim 15, wherein the ratio ($D_2/D_S$) between the diameter of said lower portion ($D_2$) and the diameter of said rotational substrate holder ($D_S$) is set to 1.2 or more.

17. The vapor deposition apparatus as claimed in claim 14, the ratio ($D_2/D_S$) between the diameter of said lower portion ($D_2$) and the diameter of said rotational substrate holder ($D_S$) is set to 1.2 or more.

18. The vapor deposition apparatus as claimed in claim 10, wherein a transition layer thickness (T) of gas flow above an upper surface of said rotational substrate holder is calculated from T=$3.22(v/\omega)^{1/2}$, where $v$ represents coefficient of kinematic viscosity (mm²/s) and $\omega$ represents an angular velocity of rotation (rad/s).

19. The vapor deposition apparatus as claimed in claim 18, wherein the rotation of said rotational substrate holder is controlled so that the transition layer thickness (T) is smaller than a height difference (H) between the lower end of said upper portion and the upper surface of said rotational substrate holder.

20. The vapor deposition apparatus as claimed in claim 10, wherein a part of said link portion and the upper surface of said rotational substrate holder are located on the same horizontal plane.

21. A vapor deposition apparatus comprising:

a hollow reactor having a gas supply port at a top portion thereof and an exhaust port at a bottom portion thereof, the gas supply port being adapted to supply reaction gas into the reactor to form a thin film on a surface of a wafer substrate;

a rotational substrate holder positioned inside the reactor, the substrate holder being adapted to seat a wafer substrate; and a straightening vane having a central portion and an outer portion extending radially outwardly from the central portion, wherein a space area is defined between the top portion of the reactor and the rotational substrate holder, the space area being divided into at least two sections by a partition member disposed radially outwardly from the rotational substrate holder, at least two reaction gas supply ports being provided to each of the sections.

22. The vapor deposition apparatus as claimed in claim 4, wherein the reactor is designed to be circular in horizontal section, and the straightening vane and the rotational substrate holder are coaxially disposed in the reactor.

23. The vapor deposition apparatus as claimed in claim 21, wherein an individual reaction gas supply system is connected through the reaction gas supply ports to each of the sections.

24. A vapor deposition apparatus comprising:

a hollow reactor having a gas supply port in the upper portion thereof and an exhaust port in the lower portion thereof, the gas supply port being adapted to supply reaction gas into the reactor to form a thin film on a surface of a wafer substrate, the reactor being sectioned into upper and lower portions having different inner diameters, the inner diameter of the upper portion being smaller than the inner diameter of the lower portion;

a link portion connecting the lower end of the upper portion to the upper end of the lower portion, the link portion having straightening gas flow-out holes;

a rotational substrate holder, which is adapted to seat a wafer substrate, positioned inside the reactor below the lower end of the upper portion; and a straightening vane having a plurality of gas holes situated in the upper portion of the reactor, wherein a space portion is provided above the link portion so as to hermetically envelop the straightening gas flow-out holes, the space portion being provided with straightening gas supply ports.

25. The vapor deposition apparatus as claimed in claim 24, wherein the space portion and the upper portion are constructed in a dual-wall structure, and an outside surface of the space portion extends from the upper end of the lower portion through the link portion.

* * * * *